(12) United States Patent
Zachariah et al.

(10) Patent No.: US 7,781,350 B2
(45) Date of Patent: Aug. 24, 2010

(54) METHOD AND SYSTEM FOR CONTROLLABLE DEPOSITION OF NANOPARTICLES ON A SUBSTRATE

(75) Inventors: Michael R. Zachariah, Potomac, MD (US); De-Hao Tsai, Silver spring, MD (US); Raymond J. Phaneuf, College Park, MD (US); Timothy D. Corrigan, Laurel, MD (US); Soo H. Kim, Rockville, MD (US)

(73) Assignee: University of Maryland, College Park, MD (US)

( * ) Notice: Subject to any disclaimer, the term of this patent is extended or adjusted under 35 U.S.C. 154(b) by 396 days.

(21) Appl. No.: 11/360,440

(22) Filed: Feb. 24, 2006

(65) Prior Publication Data

US 2007/0111537 A1   May 17, 2007

Related U.S. Application Data

(60) Provisional application No. 60/656,454, filed on Feb. 25, 2005.

(51) Int. Cl.
*H01L 21/31* (2006.01)

(52) U.S. Cl. .............. 438/776; 438/962; 257/E29.07; 257/E29.174

(58) Field of Classification Search ............ 977/951, 977/936, 762; 438/22, 47, 962; 257/E29.07, 257/E51.023, E29.174
See application file for complete search history.

(56) References Cited

U.S. PATENT DOCUMENTS 5,528,034 A * 6/1996 Yamazaki et al. ............. 850/43

OTHER PUBLICATIONS

Jacobs, H., et al., "Approaching Nanoxerography: The Use of Electrostatic Forces to Position Nanoparticles with 100 nm Scale Resolution", Adv. Mater., vol. 14, No. 21, Nov. 4, 2002, pp. 1553-1557.

(Continued)

*Primary Examiner*—David Vu
*Assistant Examiner*—Jonathan Han
(74) *Attorney, Agent, or Firm*—Rosenberg, Klein & Lee

(57) ABSTRACT

In a method and system for controllable electrostatic-directed deposition of nanoparticles from the gas phase on a substrate patterned to have p-n junction(s), a bias electrical field is reversely applied to the p-n junction, so that uni-polarly charged nanoparticles are laterally confined on the substrate by a balance of electrostatic, van der Waals and image forces and are deposited on a respective p-doped or n-doped regions of the p-n junction when the applied electric field reaches a predetermined strength. The novel controllable deposition of nanoparticles employs commonly used substrate architectures for the patterning of an electric field attracting or repelling nanoparticles to the substrates and offers the opportunity to create a variety of sophisticated electric field patterns which may be used to direct particles with greater precision.

14 Claims, 25 Drawing Sheets

OTHER PUBLICATIONS

Barry, C., "Printing nanoparticles from the liquid and gas phases using nanoxerography", Nanotechnology, vol. 14, 2003, pp. 1057-1063.

Barry, C., et al., "Printing nanoparticle building blocks from the gas phase using nanoxerography", Applied Physics Letters, vol. 83, No. 26, Dec. 29, 2003, pp. 5527-5529.

Hinds, W.; Excerpts from: Aerosol Technology, 2nd Edition, Wiley-Interscience; 1999, pp. 42-49, 111-112, 150-153, 316 and 318-319.

Fissan, H., et al.; "Nanoparticles from the gas phase as building blocks for electrical devices"; Journal of Nanoparticle Research; vol. 5, 2003, pp. 299-310.

Ermak, D., et al.; "Numerical Integration of the Langevin Equation: Monte Carlo Simulation"; Journal of Computational Physics; vol. 35 (2), 1980, pp. 169-182.

Kulkarni, P., et al.; "A Brownian Dynamics Simulation to Predict Morphology of Nanoparticle Deposits in the Presence of Interparticle Interactions"; Aerosol Science and Technology; vol. 38, 2004, pp. 541-554.

Krinke, T., et al.; "Microscopic aspects of the deposition of nanoparticles from the gas phase"; Journal of Aerosol Science; vol. 33 (10), 2002, pp. 1341-1359.

Park, J., et al.; "Investigation of the direct electromigration term for Al nanodots within the depletion zone of a pn junction"; Journal of Applied Physics; vol. 94 (10), 2003, pp. 6883-6886.

Kruis, F., et al.; "Synthesis of nanoparticles in the gas phase for electronic, optical and magnetic applications—A Review"; Journal of Aerosol Science; vol. 29 (5-6), 1998, pp. 511-535.

Buh, G., et al.; "Imaging of a silicon pn junction under applied bias with scanning capacitance microscopy and Kelvin probe force microscopy"; Applied Physics Letters; vol. 77 (1), 2000, pp. 106-108.

Doukkali, A., et al.; "Surface potential mapping of biased pn junction with Kelvin probe force microscopy: application to cross-section devices"; Applied Surface Science; vol. 235 (4), pp. 507-512.

Mizutani, T., et al.; "Measurement of Contact Potential of GaAs/AlGaAs Heterostructure Using Kelvin Probe Force Microscopy"; Japan Journal of Applied Physics; Part 2—Letters, vol. 38 (7A), 1999, pp. L767-L769.

Robin, F., et al.; "Investigation of the cleaved surface of a p-i-n laser using Kelvin probe force microscopy and two-dimensional physical simulations"; Applied Physics Letters; vol. 76 (20), 2000, pp. 2907-2909.

Reuter, D., et al.; "Depletion characteristics of two-dimensional lateral p-n junctions"; Applied Physics Letters; vol. 86 (16), 2005, id. 162110 (3 pages.).

Achoyan, A., et al.; "Two-Dimensional p-n Junction under Equilibrium Conditions"; Semiconductors, vol. 36 (8), 2002, pp. 903-907.

Su, K. et al.; "Interparticle Coupling Effects on Plasmon Resonances of Nanogold Particles"; Nano Letters; vol. 3 (8), 2003, pp. 1087-1090.

Park, H., et al.; "Brownian dynamic simulation for the aggregation of charged particles"; Journal of Aerosol Science; vol. 32 (11), 2001, pp. 1369-1388.

Kadaksham, A., et al.; "Dielectrophoresis of nanoparticles"; Electrophoresis vol. 25, 2004, pp. 3625-3632.

Krinke, T., et al.; "Positioning of nanometer-sized particles on flat surfaces by direct deposition from the gas phase"; Applied Physics Letters; vol. 78 (23), 2001, pp. 3708-3710.

Krinke, T., et al.; "Nanostructured Deposition of Nanoparticles from the Gas Phase"; Particle & Particle Systems Characterization; vol. 19 (5), 2002, pp. 321-326.

* cited by examiner

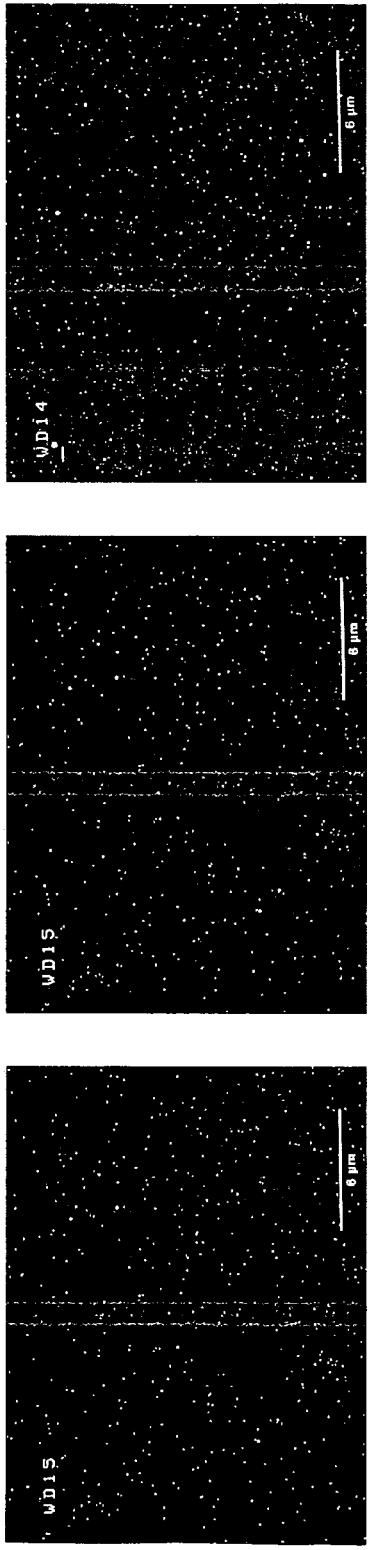
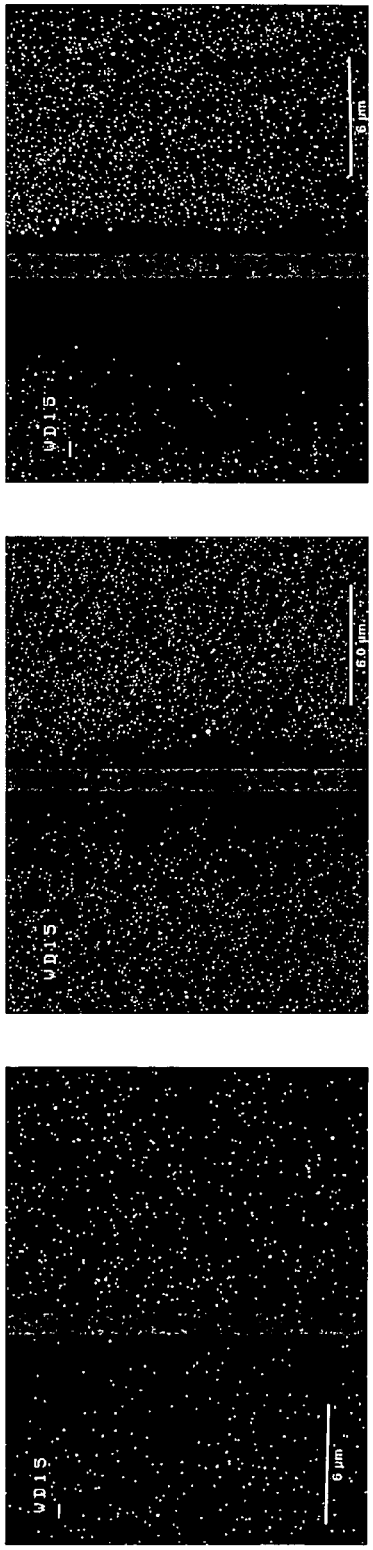
FIG. 14A FIG. 14B FIG. 14C FIG. 14D FIG. 14E FIG. 14F

METHOD AND SYSTEM FOR CONTROLLABLE DEPOSITION OF NANOPARTICLES ON A SUBSTRATE

REFERENCE TO RELATED APPLICATIONS

This Utility Patent Application is based on Provisional Patent Application Ser. No. 60/656,454 filed 25 Feb. 2005.

STATEMENT OF FEDERALLY SPONSORED RESEARCH/DEVELOPMENT

This invention was made with Government Support under Contract Number H9823004C0448 awarded by the National Security Agency. The Government has certain rights in the invention.

FIELD OF THE INVENTION

This invention relates to manufacture of microelectronic devices. In particular, the present invention relates to the fabrication of nano-scale electronic systems.

In overall concept, the present invention is related to a controllable deposition of nanoparticles on a substrate which is p-n junction patterned in compliance with the architecture of a nanoparticle-based device to be fabricated.

Further, the present invention relates to positioning metal nanoparticles from the gas phase onto substrates by using electrostatic forces generated by a biased p-n junction created on a substrate.

BACKGROUND OF THE INVENTION

Functional nanoparticles have been widely considered as the building blocks of potential micro- and nano-scale electronic, optoelectronic devices, gas sensors, as well as a wide variety of other electronic devices. The production of nanoparticles by using gas phase is a clean continuous process which can be operated at atmospheric conditions without requiring any vacuum environment or solvent medium. Fabrication of nanoparticle based devices requires an accurate alignment of nanoparticles in specific locations on a device substrate. An effective method to position particles is through the use of electrostatic forces.

For example, it was demonstrated (Barry C. R., Lwin N. Z., Zheng W., Jacobs H. O., Applied Physics Letters, 2003, 83 (26): 5527-5529; Barry C. R., Steward M. G., Lwin N. Z., Jacobs H. O., Nanotechnology, 2003, 14 (10): 1057-1063; and Jacobs H. O., Campbell S. A., Steward M. G., Advanced Materials, 2002, 14 (21): 1553) that charged carbon nanoparticles can be aligned with an electric field on a charge-patterned substrate.

A contact charging method has been developed which employs a metal-coated polymer stamp to form charging patterns on an insulating substrate. In this method, the oppositely charged nanoparticles are attracted and aligned (Fissan H., Kennedy M. K., Krinke T. J., Kruis F. E., Journal of Nanoparticle Research, 2003, 5 (3-4): 299-310; Krinke T. J., Deppert K., Magnusson M. H., Fissan H., Particle & Particle Systems Characterization, 2002, 19 (5): 321-326; and Krinke T. J., Fissan H., Deppert K., Magnusson M. H., Samuelson L., Applied Physics Letters, 2001, 78 (23): 3708-3710).

For 30 nm-sized particles, the best lateral resolution achieved with this method has been about ~100 nm. However, the gas-phase patterning of nanoparticles on a charge-patterned substrate has many technical shortcomings, including: (i) failure to attain stable patterns causing the change of the deposition pattern during the particle deposition process, (ii) high possibility for damaging the metal-coated polymer stamp during the charging process, as well as (iii) the necessity of using an insulated surface on the substrate which limits its applications especially for metal-semiconductor devices.

Thus, a new and innovative controllable nanoparticle alignment and deposition technique is needed to obviate the disadvantages of prior art methods.

SUMMARY OF THE INVENTION

It is an object of the present invention to provide a method and system for controlling the deposition of nanoparticles on a substrate, in which a stable deposition pattern can be formed on a substrate which possesses thermal as well as chemical stability and can be fabricated with traditional microelectronic manufacturing methods.

It is a further object of the present invention to provide a technique for precisely directing the motion and controllable deposition of charged metal nanoparticles from the gas phase onto substrates by using the electrostatic force generated by reverse biased p-n junction patterned on the substrate.

It is also an object of the present invention to provide a technique for controlling the deposition and alignment of nanoparticles on a substrate by means of patterning the electric field attracting or repelling the charged nanoparticles by patterning the substrate with an array of p-doped and n-doped regions with p-n junctions formed therebetween in accordance with the architecture of a nanoparticle-based device to be fabricated.

A method of the present invention for controllable deposition of nanoparticles on a substrate includes the following steps:

forming on the substrate a pattern of p-doped and n-doped regions with respective p-n junctions established therebetween;

generating a plurality of nanoparticles in the gaseous phase thereof;

imposing a predetermined polarity on the generated nanoparticles, and applying an electric field formed by reversely biasing the p-n junctions formed on the substrate.

The electric field is adjusted to a predetermined level at which the polarized nanoparticles are deposited either on p-doped regions or n-doped regions on the substrate depending on the polarity of the nanoparticles. The unipolarly-charged nanoparticles are selectively deposited only on the specific positions having the opposite sign of the electric field (e.g., using attractive electrostatic force).

The method further includes the step of changing the polarity of nanoparticles in opposing relation in order to deposit the nanoparticles on an oppositely charged one of the p-doped and n-doped regions. When the nanoparticles are charged with a negative polarity they are deposited on the n-doped regions. Opposingly, when the nanoparticles are charged with a positive polarity they are deposited on the p-doped regions.

In the method of the present invention, the substrate is patterned with traditional microelectronic process methods and the array of the p-doped and n-doped regions are formed in accordance with a particular design of a nanoparticle-based device to be fabricated. In its simplest form, the p-n junction created between respective p-doped and n-doped regions is a planar p-n junction.

The polarized nanoparticles are supplied into a deposition chamber at a predetermined distance from the patterned substrate in a manner that the electric field generated from reversely biasing the p-n junction directs the nanoparticles towards the substrate.

In the method, the size of the nanoparticles, as well as the temperature and/or pressure in the deposition chamber can be controlled in order to attain the required deposition quality.

In an additional aspect thereof, the present invention represents a system for controllable deposition of nanoparticles on a substrate, which comprises a source of nanoparticles, e.g., a unit generating a vapor containing a plurality of nanoparticles, a charger for imposing a predetermined polarity on the generated nanoparticles, and a power source coupled to the p-n junction patterned on the substrate to apply an electrical field thereto which biases the p-n junction in the reverse mode. The nanoparticles are deposited on a respective one of the p-doped and the n-doped regions patterned on the substrate once the electric field applied to the p-n junction reaches a predetermined level.

In the system of the present invention, the nanoparticles generating unit includes a solid target (formed from a material required for being deposited onto the substrate during the nanoparticle deposition process) and a laser. The vapor of the nanoparticles is created by a pulse laser ablation technique when the laser beam is focused on the solid target to evaporate the material of the solid target.

Alternatively, the nanoparticles generating unit may include an atomizer to produce an aerosol containing nanoparticles.

The nanoparticles of a certain size range are preferred for the deposition process. In order to create a needed narrow size range of the nanoparticles, the aerosol is passed through a differential mobility analyzer (DMA) which performs the ion-mobility separation of the charged particles to create a narrow size cut.

The system further includes a furnace receiving the vapor containing nanoparticles to sinter the nanoparticles at a predetermined temperature which in some cases approximates 1000° C. The charger unit is a uni-polar charger which may comprise a radioactive ionizing device.

A power supply is coupled to a controller which varies the electric field applied to the p-n junction patterned on the substrate to reach a predetermined electrical field level at which the deposition of nanoparticles on the substrate occurs.

The nanoparticles may include nanoparticles of a wide variety of materials for use in nano-scale fabrication, and preferably, but not limited to, metal nanoparticles.

These and other features and advantages of the present invention will become clear from the further description of the present invention taken in conjunction with the Patent Drawings.

BRIEF DESCRIPTION OF THE DRAWINGS

FIG. 17A represents a trajectory of a particle at the p-n junction. Curve 1 is a trajectory of the particle attracted by N-type depleted charges. Curve 2: If not deposited, the particle was lift up by the repulsive force from the P-type depleted charges. Curve 3: When the particle was convected out of the P-type region, it was dragged down by the attractive force from the N-type depleted charges. FIG. 17B is a particle trajectory at four different free stream velocities: 0.2, 0.3, 0.4, and 1 m/s;

DESCRIPTION OF THE PREFERRED EMBODIMENTS

Figure 1:
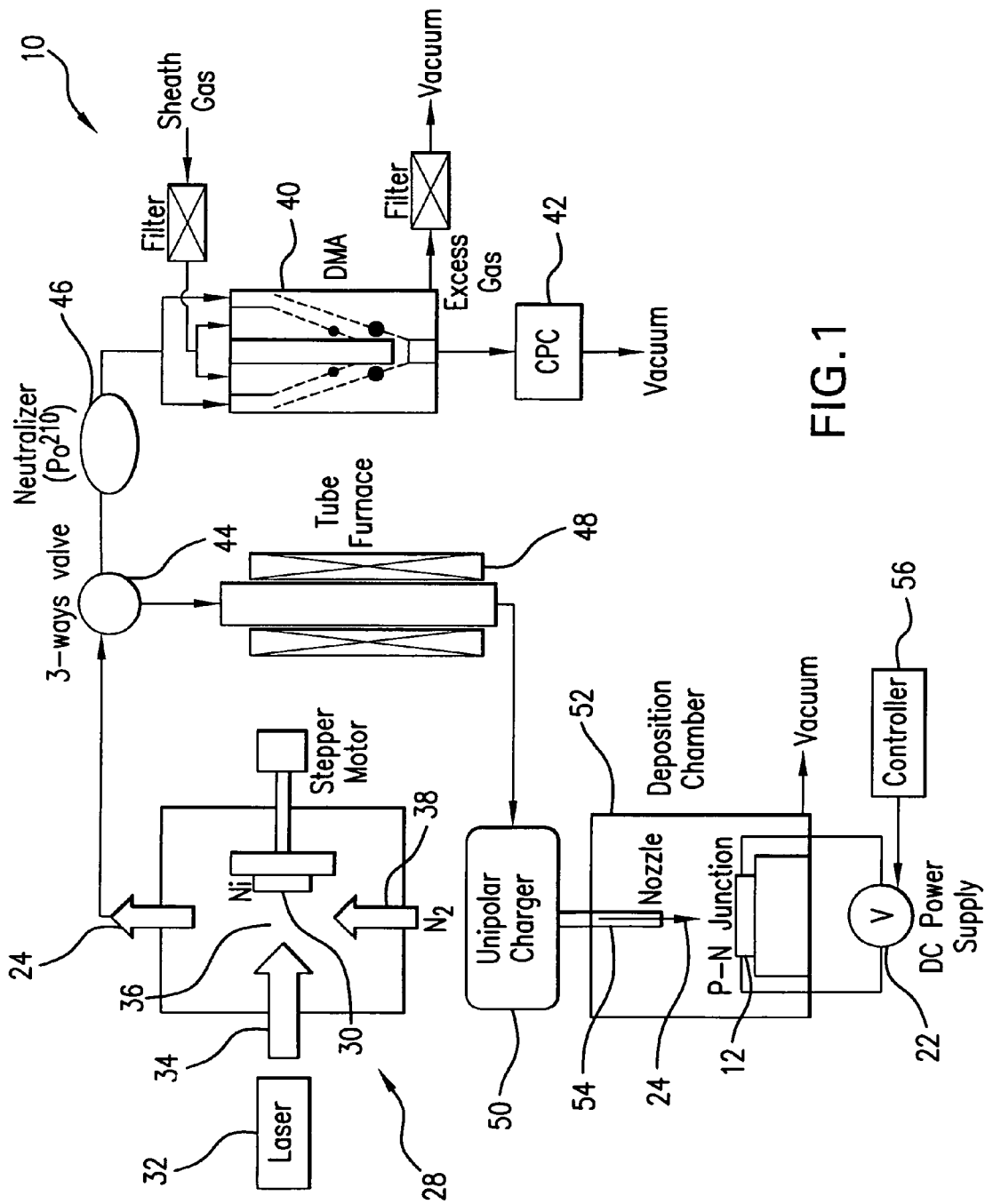
FIG. 1 is a schematic diagram of the system of the present invention for controllable deposition of nanoparticles on a substrate.
Figure 2A:
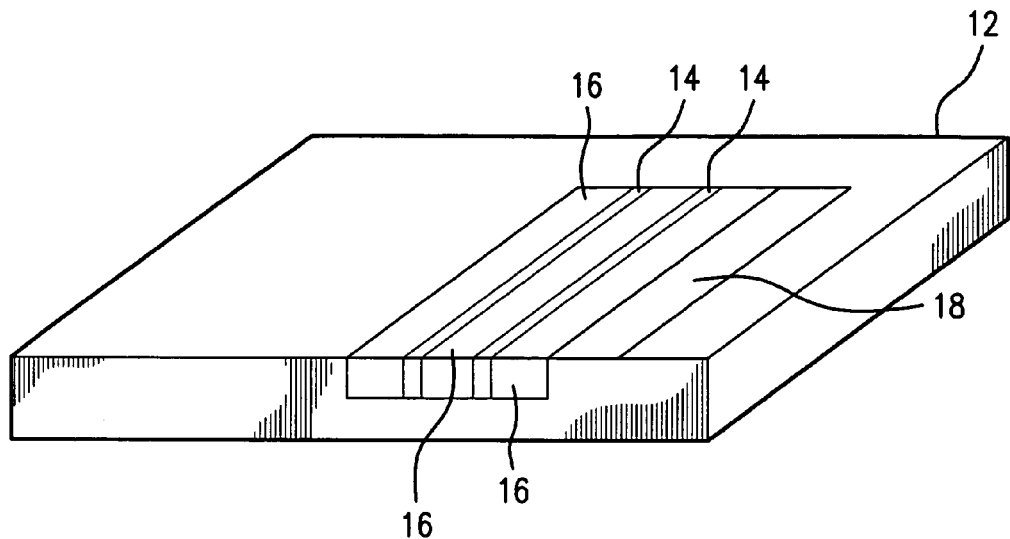
FIG. 2A is a schematic representation of a patterned substrate.

Referring to FIG. 1, a system 10 is shown for controllable nanoparticle deposition. A patterned substrate 12 shown in FIG. 2A, is patterned with an array of p-doped regions 14 and n-doped regions 16. The stripe-like pattern of p- and n-doped regions shown in FIG. 2A is only presented as an example. The p- and n-doped regions may be arrayed in any fashion to comply with an architecture of a nanoparticle-based device 18 to be fabricated on the substrate 12.

Figure 2B:
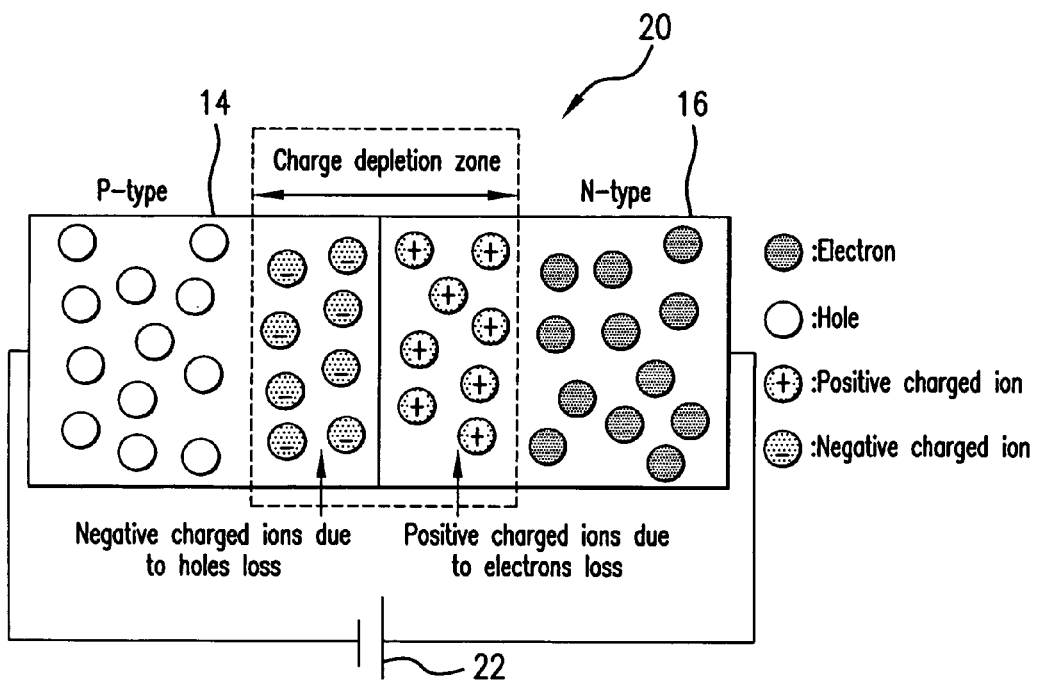
FIG. 2B is a schematic representation of a p-n junction patterned on the substrate showing the charge mechanism and the formation of the charge depletion zones.

FIG. 2B illustrates in simplified form a p-n junction 20 formed on the substrate by respective p-doped region 14 and n-doped region 16. In the region where the p- and n-doped regions 14 and 16 are in contact, the electrons from the n-type region 16 diffuse towards the p-type region 14 and combine with the holes to form a charge depletion zone and the build-up of a net charge in each region.

When a reverse bias is applied to the p-n junction, the width of the charge depletion zone is increased, and an additional electric field is established on the charge depletion zone. The present invention takes advantage of the field generated in the depletion zone under various conditions of reverse bias supplied from the power source 22 for controllably directing the motion and deposition of charged nanoparticles 24 existing in the gaseous phase above the substrate 12.

An analysis of the expected magnitudes of the forces and the deposition selectivity is presented in following paragraphs.

The electric field E in the vertical direction of the substrate, Y is given by:

$$E = \frac{Q}{4\pi\varepsilon_g\varepsilon_0 r^2} \times \frac{Y}{r}, \quad (\text{Eq. 1})$$

wherein $r=\sqrt{X^2+Y^2}$, X is the horizontal distance between a particle and the charged surface of a substrate, Y is the vertical distance between a particle and the substrate, $\varepsilon_g$ is the dielectric constant of the carrier gas $N_2$ (1.0006), and Q is the charge generated on the charge depletion zone of a p-n junction-patterned substrate.

In a particular example, and not to limit the broadness of the scope of protection of the present invention, the p-n junction-patterned substrate 12 is patterned to include arrays of Zn-doped GaAs stripes 14 (p-type, number concentration of acceptors $N_A=10^{19}$ cm$^{-3}$; 0.3 cm in length; 1-2 μm in width; 30 μm gap between p-stripes 14) within Si-doped GaAs regions 16 (n-type, number concentration of donors ($N_D$)= $10^{18}$ cm$^{-3}$, which is shown in FIG. 2A. The calculated built-in potential ($V_{bi}$) of the substrate 12 is 1.45 V. The built-in potential $V_{bi}$ is then calculated with the following expression:

$$V_{bi} = \frac{kT}{e}\ln\left(\frac{N_A N_D}{N_i^2}\right), \quad (\text{Eq. 2})$$

wherein k is Boltzmann's constant, T is the temperature, $N_i$ is the intrinsic carrier concentration of GaAs (1.79×10$^6$ cm$^{-3}$) and e is the elementary unit of charge (1.6×10$^{-19}$ C). The total width of the charge depletion zone, $d_{n+p}$ is estimated to be about 50 nm with the following expression:

$$d_{n+p} = (1 + \frac{N_D}{N_A}\left[\frac{2\varepsilon_s\varepsilon_0 V_{bi} N_A}{e(N_D^2 + N_A N_D)}\right]^{0.5}, \quad (\text{Eq. 3})$$

wherein $\varepsilon_s$ is the dielectric constant of a GaAs substrate (13.1) and $\varepsilon_0$ is the permittivity of free space (8.8542×10$^{-12}$ C$^2$/Nm$^2$).

To simplify the calculation of the electric field generated from the p-n junction, the thickness of p-type-doped GaAs layer on this substrate is assumed to be 1 μm. The length of the P-type stripe is 0.3 cm. With the parameters of $N_A$, $N_D$, and $d_{n+p}$, the net charge in the depletion zone (Q) can be estimated and E, the generated field, can be estimated using Eq. 1.

Figure 3:
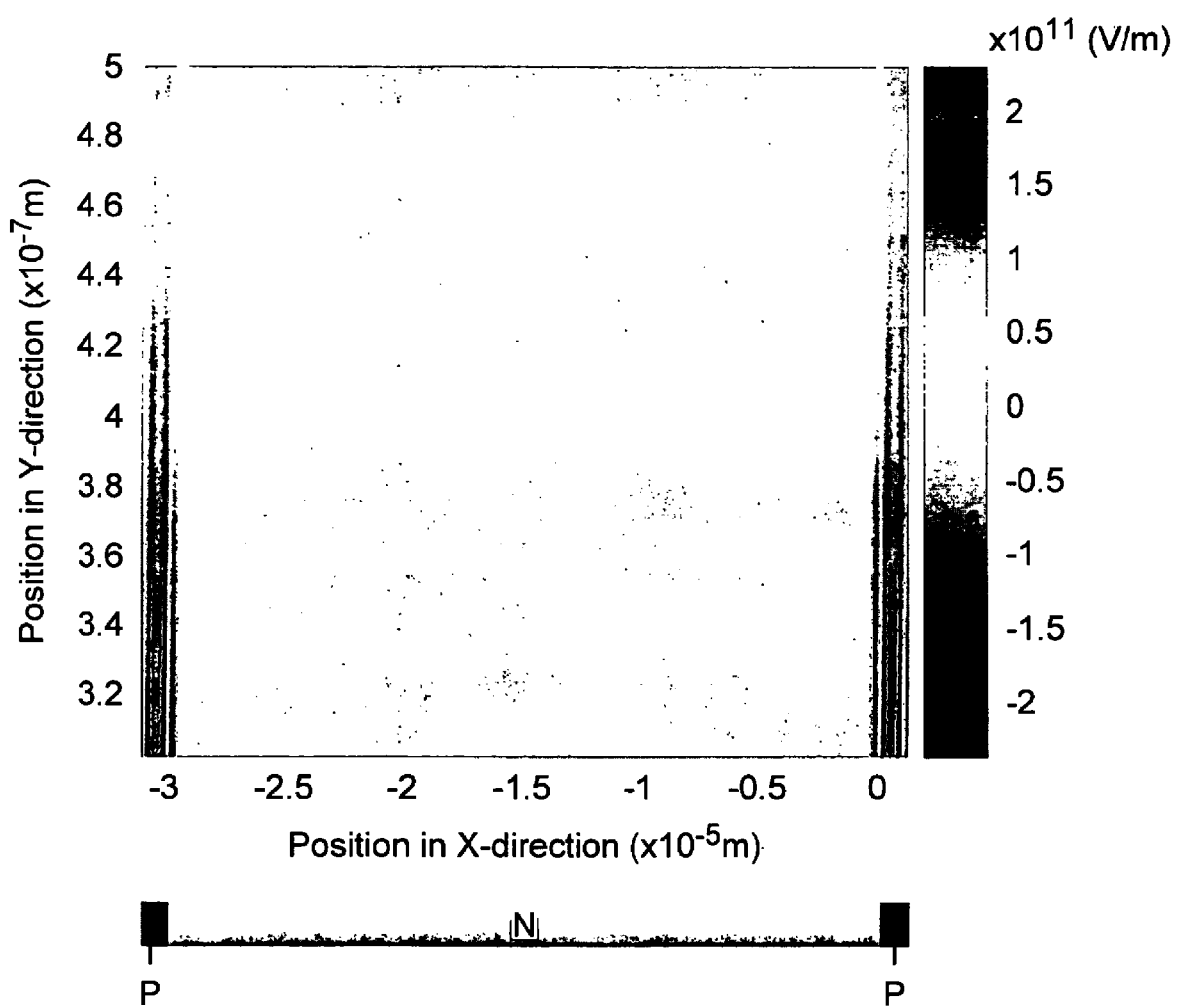
FIG. 3 is a two-dimensional diagram of the electric field strength in the p-n junction patterned substrate.

Referring to FIG. 3, which is a 2-dimensional plot of the electric field for a bias voltage of 0.9V applied to the p-n junction 20, it may be seen that near the p-n junction 20, a strong electric field (>10$^{11}$ V/m) is generated. The electric field decays as a function of distance from the surface of the substrate 12. The electric field in the n-type region 16 is much weaker (~10$^8$ V/m) than that of the p-type region 14 (>10$^{10}$ V/m) due to the relatively broad width of the n-type region. The 2-dimensional electrostatic field of FIG. 3 can be used to calculate the net external force applied to the nanoparticles 24 in the vertical direction. The electrostatic force exerted on a charged nanoparticle is given by, $$F_e = neE \quad (\text{Eq. 4})$$

wherein n is the number of unit charges of an incoming nanoparticle, and E is the net electric field generated from the p-n junction patterned substrate (as obtained from Eq. 1).

Taking into account the van der Waals force ($F_{vdw}$) and the image force ($F_i$) between particles and the substrate, the net external forces ($F_{ext}$) on a particle in the vertical direction is obtained as follows:

$$F_i = -\frac{(ne)^2}{4\pi\varepsilon_s\varepsilon_0(2Y)^2}\frac{\varepsilon_s - \varepsilon_g}{\varepsilon_s + \varepsilon_g} \quad (\text{Eq. 5})$$

$$F_{vdw} = -\frac{2}{3}A_h\frac{\left(\frac{d}{2}\right)^3}{\left(Y-\frac{d}{2}\right)^2\left(Y+\frac{d}{2}\right)^2} \quad (\text{Eq. 6})$$

$$F_{ext} = F_e + F_{vdw} + F_i, \quad (\text{Eq. 7})$$

wherein d is the particle diameter and $A_h$ is the Hamaker constant (=A×10$^{-19}$ J). It is to be noted that both $F_{vdw}$ and $F_i$ are attraction forces.

The net external force exerted on a spherical particle is a function of the position (X, Y) of the particle above the substrate. When nanoparticles 24 are initially located far from the substrate (Y>>100 nm), the electrostatic force is relatively strong compared with the van der Waals ($F_{vdw}$) and image ($F_i$) forces so that the trajectory of nanoparticles is dependent only on the electrostatic force $F_e$. Due to the random nature of Brownian motion, a direct calculation including this effect becomes computationally quite expensive. However, Brownian motion is only important when the electric force is weak. Once a particle is close to the surface of the substrate (Y<100 nm), the effect of Brownian motion becomes negligible due to a significant increase in the $F_e$, $F_{vdw}$, and $F_i$. At these conditions, the calculation is initialized with a specified particle convective velocity at a height of 100 nm above the substrate.

A thorough theoretical model has been built which will permit to control the nanoparticles deposition process better by a deeper understanding of each factor involved in the deposition system, including Brownian motion which has not been investigated before. This complete theoretical model will be presented in detail further herein in conjunction with FIGS. 9-11.

Figure 4:
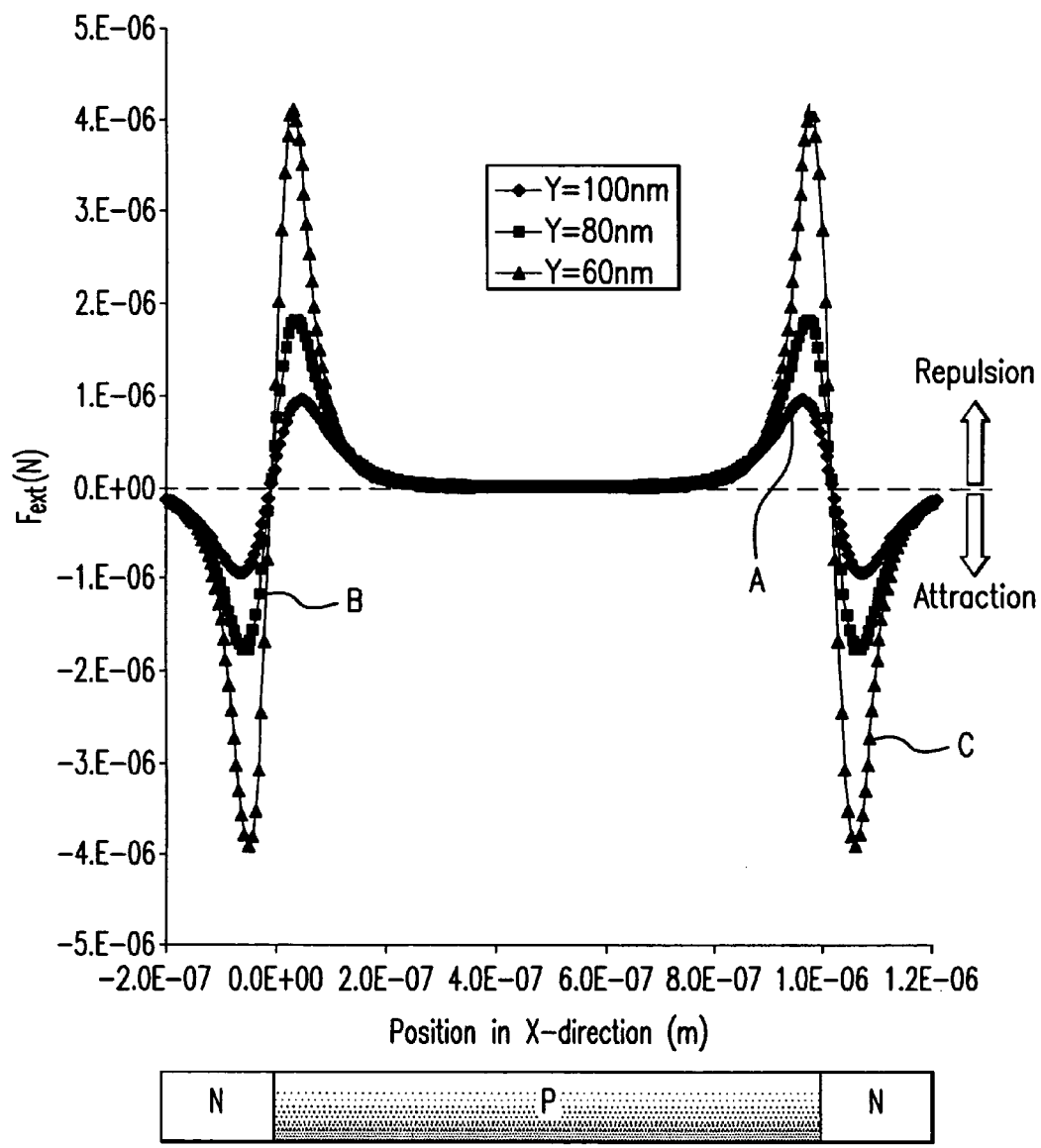
FIG. 4 is a diagram representing the net external force on an incoming negatively charged nanoparticle across a p-n junction—patterned substrate.

FIG. 4 presents the net external force acting on a negatively charged 50 nm particle assuming singly charged particles at an applied bias of −0.9 V. The curves A, B, and C express different vertical positions at Y=60 nm, 80 nm, and 100 nm, respectively. Positive and negative values of the net external force represent repulsive and attractive forces, respectively. As can be seen, the negatively charged particles are repelled by p-type regions and attracted by n-type regions especially at the interface of a p-n junction. As the negatively charged particles get closer to the substrate, they experience a stronger attraction or repellant force. If the polarity of the particle is changed to positive, the particle preferentially will be arrayed in the P-type regions.

Referring again to FIG. 1 which schematically depicts the system 10 of the present invention, nickel nanoparticles were generated in a unit 28 by pulsed laser ablation (PLA) from a solid nickel target 30 (99.995%, Lesker, 1" O.D.×0.125" in thickness), using a 1064 nm Q-switched Nd:YAG laser 32 operating at 10 Hz with a pulse duration of 4 ns. The choice of nickel was based on the eventual goal of using the particles as catalysts for carbon nanotube growth. The laser beam 34 generated by the laser 32 is focused on the solid nickel target 30 to vaporize the target material due to local micro-plasma formation on the target surface. The generated nickel vapor 36 is continuously swept by 2 lpm nitrogen carrier gas 38, and then rapidly quenched and nucleated into nickel nanoparticles 24 in the gas phase.

It is to be noted by those skilled in the art that the choice of the target material, as well as operation parameters of the pulse laser deposition, have been presented herein as an example only, and other materials, as well as alternative regimes of operation can be used, depending on the required application of the subject technique.

The particle size distribution of nickel nanoparticles 24 generated by PLA is measured by a differential mobility analyzer 40 (DMA model 3081, TSI, Inc.) for selecting monodisperse particles based on their electrical mobility. A condensation particle counter 42 (CPC, model 3025A, TSI, Inc.) has been successfully used for counting the number concentration.

A 3-way valve 44 installed at the output of the unit 28, is used to either allow the flow of the nanoparticles 24 to the DMA 40 (through a neutralizer 46) or to pass the nanoparticles 24 to a tube furnace 48. The polydisperse nickel particles 24 are sent to the tube furnace 48 to sinter the particles at 1000° C. The sintered particles are then passed through a unipolar charger 50 which may be composed of six radioactive ionizing Po-210 strips (0.5 mCi) circumferentially placed at the entrance of the charger. A ±300 V/cm DC field is used in the charger 50 to remove either positive or negative ions so that only one polarity of ions remains in the charger. Inside the unipolar charger, nanoparticles 24 become uni-polarly charged by the charge transfer from the gas-ions.

The design, as well as functional and operational principles of the differential mobility analyzer, condensation particle counter, tube furnace, as well as uni-polar charger are known to those skilled in the art, and therefore, are not described herein in detail.

For particle deposition, the p-n junction-patterned substrate 12 is connected to a DC power supply 22 and placed in a deposition chamber 52 (having in this example an internal diameter of 9 cm, and height of 10 cm). The chamber 52 has an aerosol feed nozzle 54 positioned 1 cm above the substrate. The reverse bias applied across the substrate 12 is varied from 0 to −2.5 V by a controller 56, and current measured is maintained at a level lower than 0.01 mA. The nanoparticle deposition pattern was observed with a Hitachi S-4000 field emission scanning electron microscope (SEM) operated at 4 kV.

Figure 5:
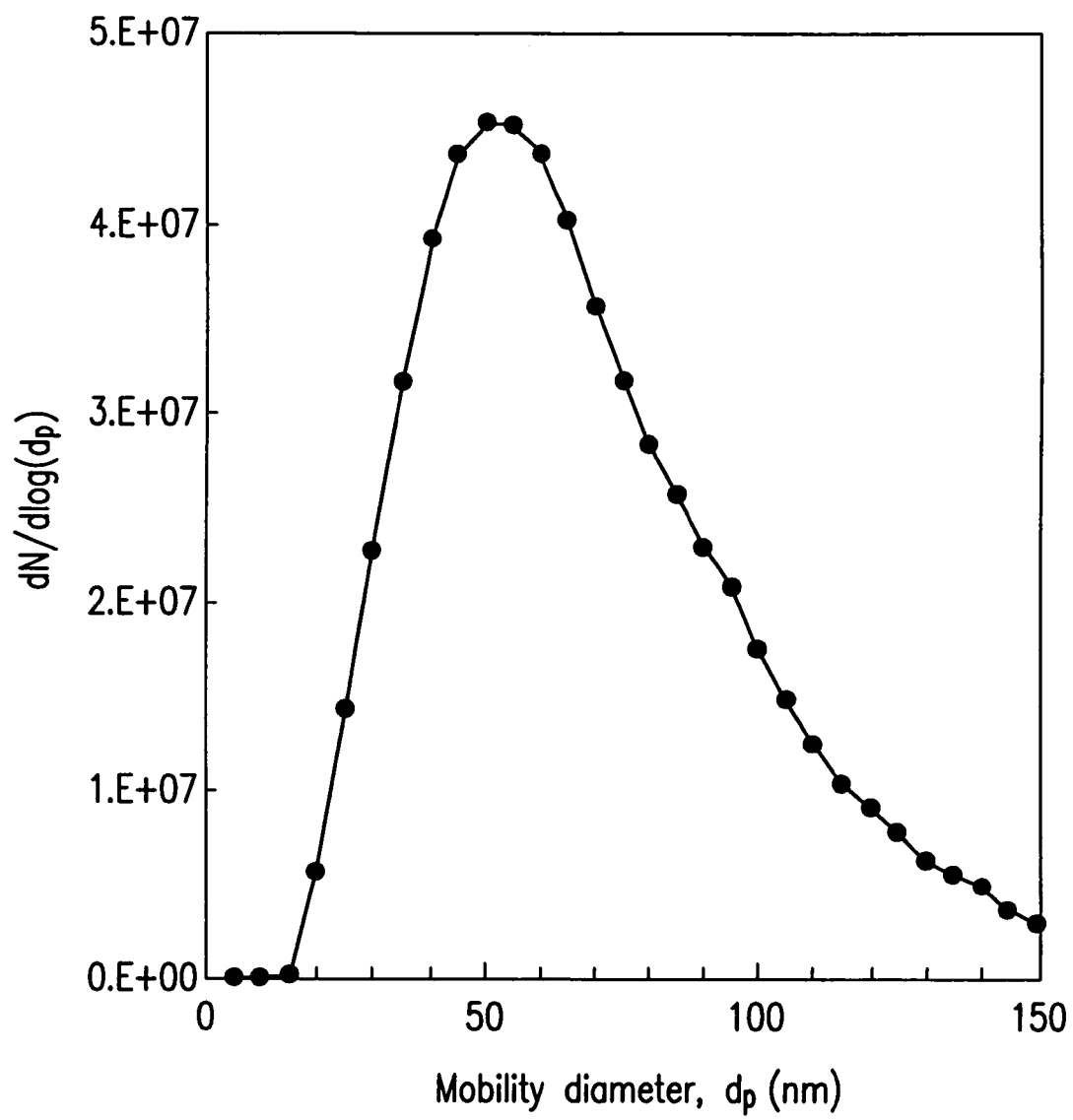
FIG. 5 is a diagram representing a particle-sized distribution of nickel nanoparticles generated by pulse laser ablation.

FIG. 5 shows the size distribution of the generated Ni nanoparticles. The diagram presented in FIG. 5 indicates a peak size of ~50 nm, and the total number concentration about $\sim 10^8$ $cm^3$. The measured built-in potential of the p-n junction-patterned substrate is about 1.2-1.5V, which is very close to the result (~1.45 V) calculated using the Eq. 2. This built-in potential was used as the zero-biased electric field in further experimentations.

FIGS. 6A-6E present the SEM images of the p-n junction-patterned substrate 12 following particle deposition for different reverse bias voltages. When no bias voltage is applied (FIG. 6A), nickel nanoparticles are homogeneously distributed on both p-type and n-type regions, indicating that the zero-biased electric field generated by the built-in potential is not sufficient to affect the trajectory of the charged particles.

Figure 6A:
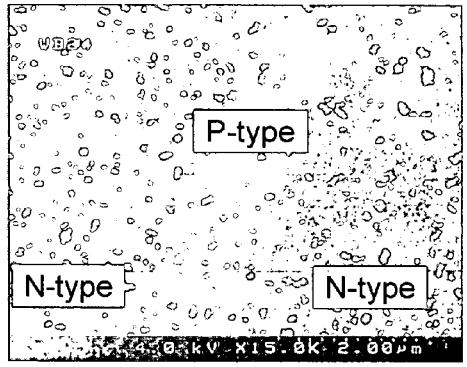
FIGS. 6A-6E are the SEM images of negatively charged nickel particles deposited on the patterned GaAs substrate with the p-n junction under different applied bias voltages.
Figure 6B:
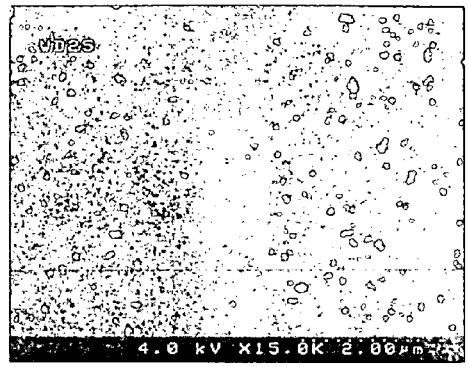
Figure 6C:
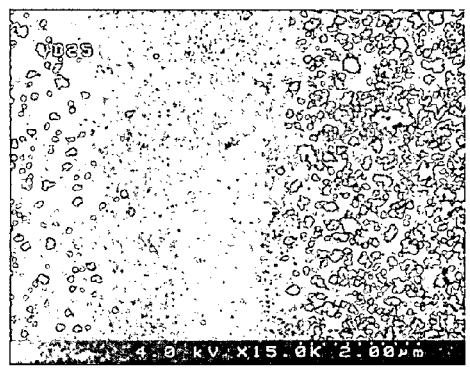
Figure 6D:
Figure 6E:
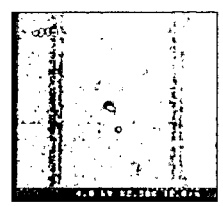

However, beginning with a reverse bias of −0.2V (FIG. 6B), a higher number of nickel nanoparticles are clearly deposited in the n-type region, indicating that negatively charged particles are being repelled by p-type regions and attracted to the n-type regions. With increasing the reverse bias (e.g., −0.5V; −0.9V) as shown in FIGS. 6C-6D, respectively, the negatively charged nickel nanoparticles are almost exclusively deposited on the n-type regions and a particle-free zone is clearly observed on p-type regions.

Figure 6F:
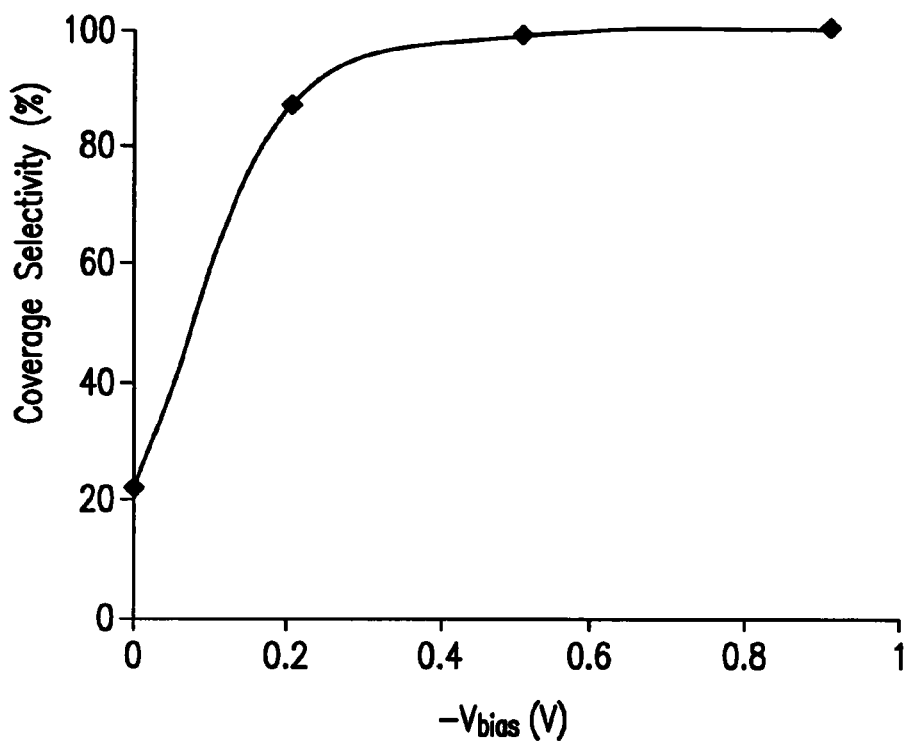
FIG. 6F is a diagram representing a coverage selectivity of the samples shown in FIGS. 6A-6E vs. the level of the applied bias field.

To quantify the difference in particle deposition level between the p and n-type regions, a coverage selectivity of particles is defined as follows:

$$\text{Coverage selectivity} = \frac{C_N - C_P}{C_N} \times 100\%, \quad \text{(Eq. 8)}$$

wherein $C_P$ and $C_N$ is the coverage of particles deposited on the p-type and the n-type regions obtained via digital image processing and presented in FIG. 6F as a function of bias voltage. When the bias voltage reached about −0.5 V the selectivity exceeded 99%. This corroborated with the fact that as the reverse bias was increased, the negative electric field generated on the p-type regions was also increased to sufficiently repel the incoming negatively charged nanoparticles, which resulted in a gradual increase in the coverage selectivity of n-type to p-type regions.

Changing particle polarity to the positive sign, attracted particles to the depletion zone of the p-type regions, and repelled them from the depletion zones of n-type regions.

Figure 7A:
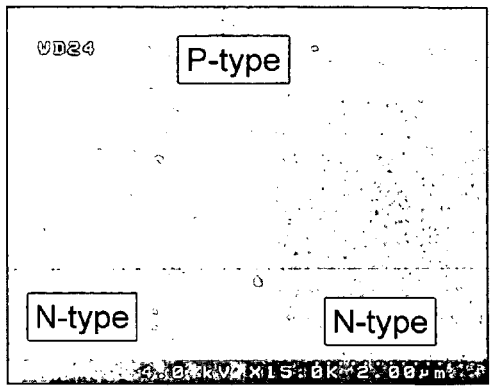
FIGS. 7A-7E are SEM images of positively charged nickel particles deposited on the patterned GaAs substrate with the p-n junction under different applied bias voltages.
Figure 7B:
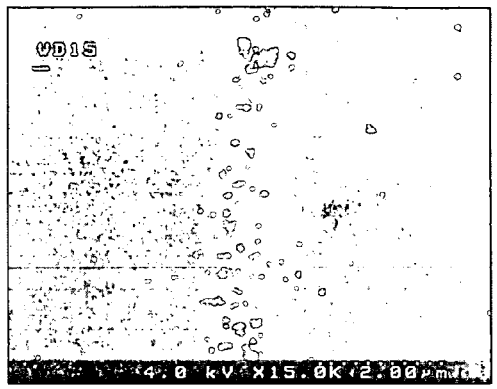
Figure 7C:
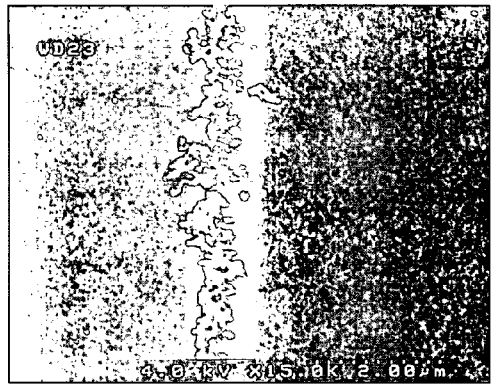
Figure 7D:
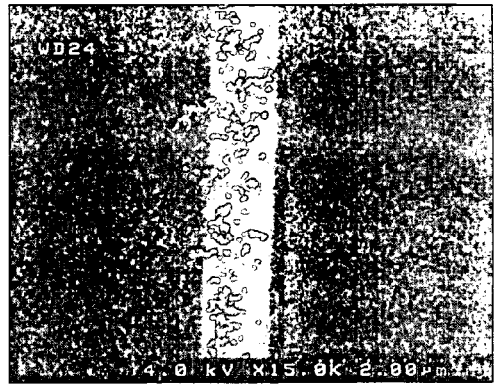
Figure 7E:
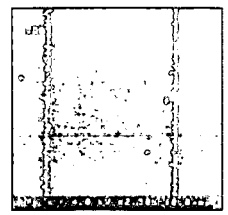

FIGS. 7A-7E present SEM images of the positively charged particles deposited on p-n junction substrates 12. As seen in FIG. 7A, there was no obvious difference between p- and n-type regions when no bias was applied indicating the built-in potential had no effect on particle deposition. However, as the reverse bias was increased, as shown FIGS. 7B, 7C, 7D, and 7E (e.g., −0.9V; 1.5V; −2.5V; and lower resolution SEM image for −2.5V, respectively), it is seen that particles were preferentially deposited on the negatively charged p-type. For the higher bias cases (FIGS. 7C-7E) dendrite-like structures were formed due to the presumable attraction of the van der Waals force between deposited particles and incoming particles from the gas phase.

Figure 7F:
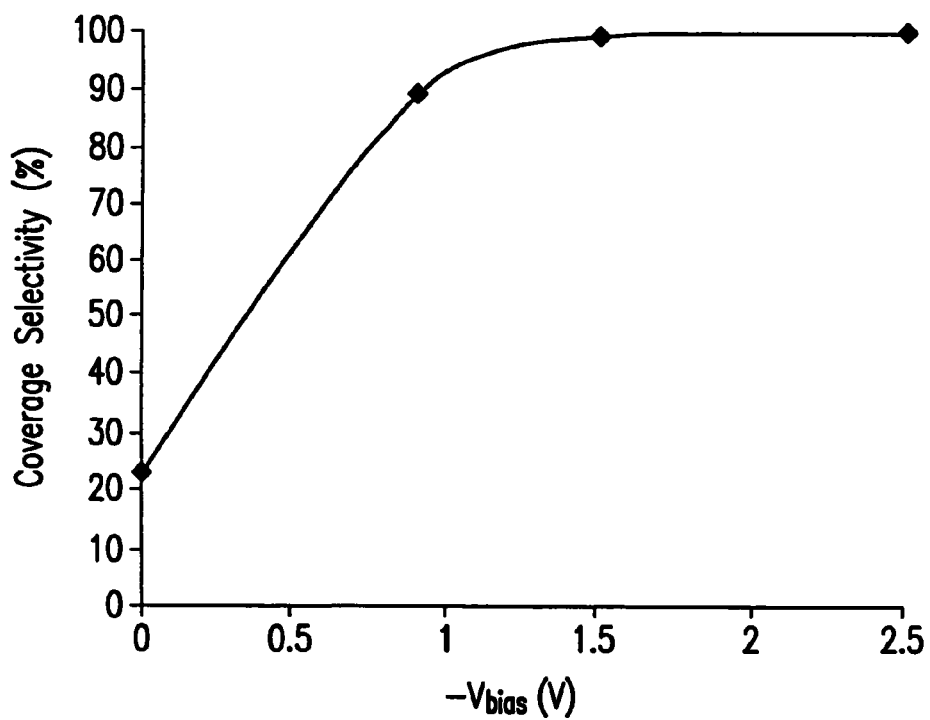
FIG. 7F is a diagram representing a coverage selectivity of the samples shown in FIGS. 7A-7D, vs. the applied bias voltages.

As shown in FIG. 7F, the coverage selectivity $(1-C_N/C_P)$ was similar to that observed for the negatively charged particles. However, unlike the formation of the particle-free zone on p-type regions for negatively charged particles, the particle-free zone for positive particles on n-type regions was not complete even with −0.9V. This is presumably due to the strength of the positive electric field generated across n-type regions which is relatively weaker than that of p-type regions, and results from the broad width of n-type regions (~30 µm) compared with the relatively narrow width of p-type regions (~1 µm) used in the experiments. Nevertheless, it is quite clear that by appropriate choice of surface patterning using simple devise structures one may be able to create nanoparticle deposited patterned surfaces.

Figure 8:
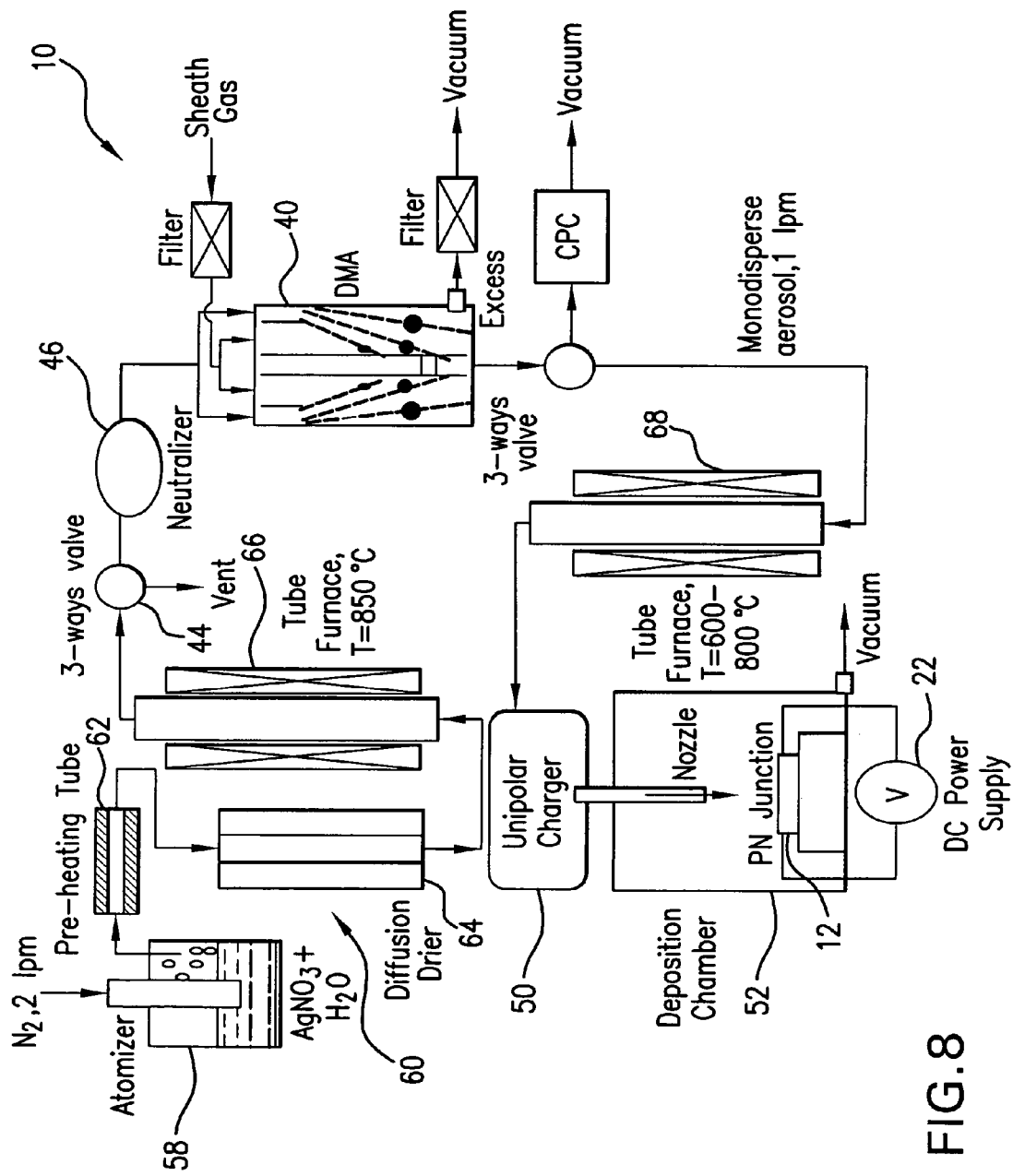
FIG. 8 is a schematic representation of the alternative design of the nanoparticles deposition system of the present invention.

Referring to FIG. 8, another experiment is conducted, in which unipolarly-charged silver nanoparticles with a narrow size distribution are synthesized by the spray pyrolysis method best described in T. C. Pluym, et al., Aero. Sci., 23, 383 (1993). The choice of silver is based on an eventual goal of using these particles for surface plasmon resonance (SPR) bio-sensing devices. A silver nitrate (99+%, Aldrich)/water solution is atomized in an atomizer 58 into droplets and passed to a 850° C. flow reactor 60 with nitrogen. The flow reactor includes a pre-heating tube 62, diffusion drier 64, and a first tube furnace 66. At the temperature ~850° C. the metal nitrate is converted to pure silver aerosol with a rather wide particle size distribution. From the flow reactor 60, the silver aerosol is delivered through the valve 44 to the DMA 40 to perform the ion-mobility separation of charged particles to create a narrow size cut in the differential mobility analyzer (DMA) 40. The output of the DMA 40, which operates like a band-pass filter, provides an output of unipolar charged monodisperse aerosol. The number concentration of monodisperse particles is ~$10^5$-$10^6$ cm$^{-3}$. These aerosol particles (1 lpm) are then delivered to a second tube-furnace 68 at 600-800° C. for the purpose of creating spherical nanoparticles. The unipolar charging process is performed in the unipolar charger 50, similar to that shown in FIG. 1, to maintain the charges on the particles before deposition. Subsequently these nanoparticles are delivered to the deposition chamber 52.

Three different sized Ag nanoparticles are generated, e.g., 30 nm, 50 nm and 70 nm in diameter, for the experiments. The deposition process is similar to the process for Ni deposition shown in FIG. 1. The flow velocity is maintained at ~1 m/s and the boundary layer is ~1.1 mm at the position of 0.3 cm away from the stagnant point. Negatively charged Ag nanoparticles are used for deposition. The applied reverse bias voltage across the substrate 12 is varied in the range from 0.1V to 0.9V. The electric field is generated from the depleted charges of p-n junctions 3-dimensionally affecting on the incoming nanoparticles flowing in the boundary layer (details of the process will be described further herein).

The nanoparticle deposition pattern is observed with a Hitachi S-4000 field emission scanning electron microscope (SEM) operated at 4-6 kV.

To quantify the difference in particle deposition level between the P and N-type regions in the calculation, the coverage selectivity of n-type to p-type regions is used defined by the (Eq. 8) previously presented herein.

Theoretical Model Of Electrostatic-Directed Assembly Approach

Figure 9:
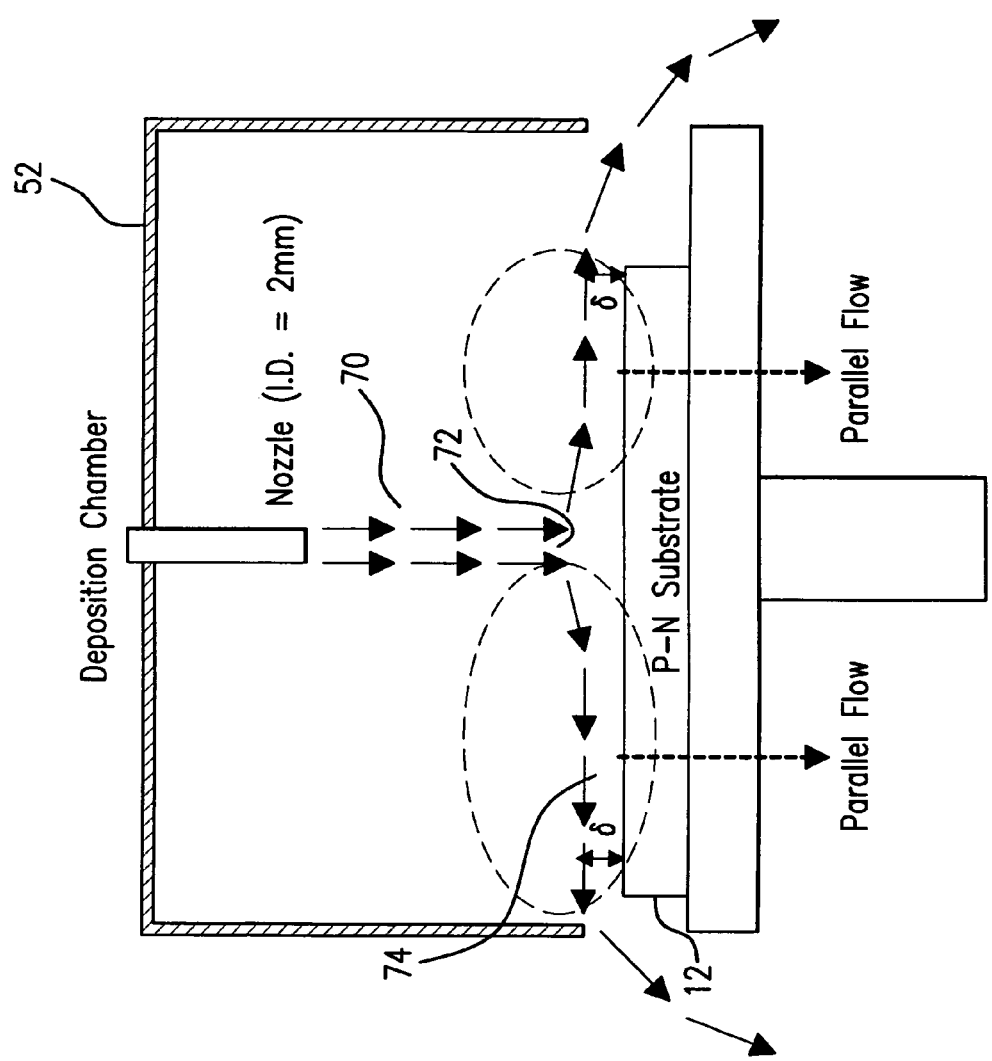
FIG. 9 is a schematic representation of the flow field above a p-n junction patterned surface.

A three-dimensional trajectory model has been developed based on the force balance of an individual particle approaching the surface of a p-n junction patterned substrate. The flow field above the p-n junction patterned surface is shown in FIG. 9. When a convective flow of carrier gas 70 approaches the substrate 12 and passes the stagnant point 72, its direction becomes parallel to the substrate surface, and then it forms a boundary layer 74. Inside the boundary layer 74, the nanoparticles are carried by the convective flow above the substrate. Based on the calculations of the experiment carried out in the system 10 of FIG. 8, it is assumed that the uniform boundary layer 74 has a thickness, δ, to be 1 mm and the free stream velocity, U, to be 1 m/s. The convective flow velocity, $v_g$, expressed in Eq. 9 is decreased as the vertical distance from the surface of the substrate, $Y_f$, is decreased in the boundary layer.

$$v_g = U\sin\left(\frac{\pi Y_f}{2\delta}\right),\qquad\text{(Eq. 9)}$$

wherein U is the free stream velocity, δ is a thickness of the boundary layer, and $Y_f$ is the vertical distance of the particle from the substrate surface.

The deposition process of nanoparticles is divided into two steps. Step 1 describes the force balance when an incoming particle is far away from the substrate. Due to the weak interaction between the incoming particle and the substrate, Brownian motion is the major effect in Step 1. Step 2 describes the trajectory of an incoming particle close to the substrate surface, where the interaction between an incoming nanoparticle and the substrate surface starts to strongly influence the particle trajectory.

Figure 10A:
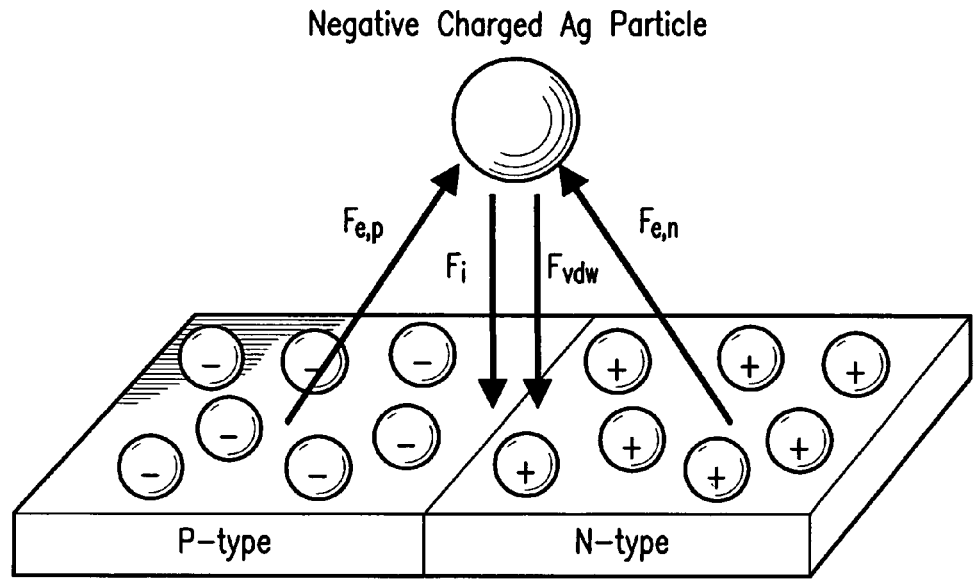
FIG. 10A shows a net external force existing between an incoming charged particle and a p-n junction.

As shown in FIG. 10A, presenting a net external force between an incoming charged particle and a p-n junction, the electrostatic force ($F_e$), van der Waals force ($F_{vdw}$) and image force ($F_i$) between an incoming particle and the substrate are the major external forces which are considered in the calculation of the net external force acting on a particle, $F_{ext}$, by using (Eq. 10).

$$F_{ext}=F_e+F_i+F_{vdw} \qquad\text{(Eq. 10)}$$

In a 3-dimensional space shown in FIG. 10A, the electrostatic force $F_e$ between an incoming charged particle and the amount of surface charges generated from the depletion zone of a p-n junction can be calculated by (Eq. 11), which is proportional to n, the number of unit charges on a particle, and $E_s$, the intensity of the surface electric field.

$$F_e=neE_s \qquad\text{(Eq. 11)}$$

Figure 10B:
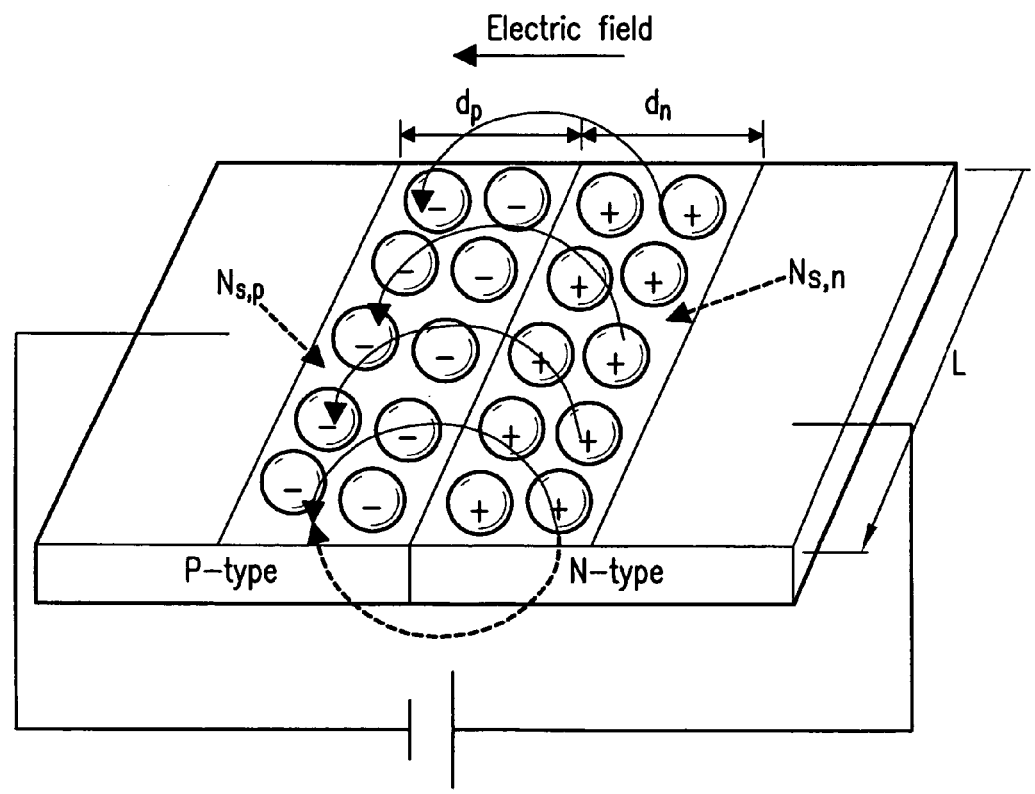
FIG. 10B shows surface charges and the surface electric field emanating from a reverse-biased p-n junction.

In the present calculation, it is assumed that nanoparticles are singly charged (n=1). To evaluate $E_s$, the amount of surface charges, $Q_{s,n}$ and $Q_{s,p}$ is calculated from P-type and N-type depletion zones regardless of the depth of a depletion zone. FIG. 10B presents surface changes and the surface electric field from a reverse-biased p-n junction. Considering that only the surface state of a p-n junction is shown in FIG. 10B, the surface charge density, $N_s$, and the surface area of the depletion zone are used to directly evaluate the amount of surface charges and the generated surface electric field. The surface charge density across the depletion zone of a p-n junction, $N_{s,p}$ and $N_{s,n}$, can be calculated by Eq. 12 and 13.

$$N_{s,p} = \frac{-\varepsilon_0 \varepsilon_s}{2e} \frac{V_s}{d_p} \quad \text{(Eq. 12)}$$

$$N_{s,n} = \frac{\varepsilon_0 \varepsilon_s}{2e} \frac{V_s}{d_n}, \quad \text{(Eq. 13)}$$

wherein $V_s$ is the surface potential across the p-n junction, $d_n$ and $d_p$ are the widths of the depletion zone on N-type and P-type region, e is the unit charge ($1.6*10^{-19}$ C), and $\varepsilon_0$ is the permittivity of the free space. The permittivity of medium, $\varepsilon_s$, is 7.05, which is calculated by assuming that the surface environment is composed of 50% of GaAs and 50% of $N_2$. The amount of surface charges on N-type and P-type region, $Q_{s,n}$ and $Q_{s,p}$ are calculated for a given length of the depletion zone, L as follows.

$$Q_{s,n} = eN_{s,n} \times d_n \times L = \frac{\varepsilon_0 \varepsilon_s V_s}{2} L \quad \text{(Eq. 14)}$$

$$Q_{s,p} = eN_{s,p} \times d_p \times L = \frac{-\varepsilon_0 \varepsilon_s V_s}{2} L \quad \text{(Eq. 15)}$$

The corresponding surface electric field, $E_{s,n}$ and $E_{s,p}$ are:

$$E_{s,n} = \frac{L}{4\pi\varepsilon_{N_2} r^2} \frac{\varepsilon_s V_s}{2} \quad \text{(Eq. 16)}$$

$$E_{s,p} = \frac{-L}{4\pi\varepsilon_{N_s} r^2} \frac{\varepsilon_s V_s}{2}, \quad \text{(Eq. 17)}$$

wherein r is the distance between an incoming particle and the surface charges on the substrate. From Eqs. 16 and 17, it can be seen that the surface electric field is proportional to the surface potential across the p-n junction, which is a sum of the built-in surface potential and the applied reverse bias voltage ($-V_{bias}$). Due to Fermi level surface pinning to the ambient air, the surface built-in potential is different than that in the bulk state, and a significant drop of surface potential comparing to the bulk built-in potential is expected. For the experiment conducted, it is assumed that the built-in surface potential in the system is 0.2V; and based on the observation, little coverage selectivity can be achieved at zero-biased condition. Because of the reduction of the surface built-in potential, the effect of the applied reverse bias voltage becomes more important. A significant depletion characteristic on the surface of a p-n junction can be observed under a highly reverse-biased p-n surface. The electrostatic force should be strong enough when enough high reverse bias voltage across the p-n junction is applied.

As it is known, both $F_i$ and $F_{vdw}$ are only dependent on the vertical separation distance, and the calculated value is ~0.1 pN when a particle is close to the substrate (Y=100 nm). In the following 3-D calculation, this part is kept the same as the previously discussed 2-D case.

Because of a significantly high relaxation time of Ag nanoparticles, $t_r$, used in the calculation (for 30 nm the relaxation time is 244 ns), it is to be taken into account for the trajectory calculation. By combining the motions affected by $F_{ext}$, drag force $F_D$, $v_g$, with Brownian motion, analytic solutions of particle trajectories can be obtained by integrating the Langvin equation (Ermak D L, Buckholz H, Journal of Computational Physics, 35 (2); 169-182 1980; Park H., et al., Journal of Aerosol Science, 32 (11): 1369-1388, November 2001). Eqs. 18 and 19 are the analytical solutions of the velocity and the displacement of a particle in x-direction during a characteristic time step, $\Delta t$. The same form can be used to describe the motion in y and z direction except when $v_g$ is assumed to be zero in y and z direction.

$$v_{x,N} = v_{x,N-1} e^{-\beta\Delta t} + \frac{F_{extx,N-1}}{m_p \beta}(1 - e^{-\beta\Delta t}) + B_{1,x} \quad \text{(Eq. 18)}$$

$$x_N = x_{N-1} + \frac{1}{\beta}\left(v_{x,N} + v_{x,N-1} - \frac{2F_{extx,N-1}}{m_p \beta}\right) \times \left(\frac{1 - e^{-\beta\Delta t}}{1 + e^{-\beta\Delta t}}\right) + \frac{F_{extx,N-1}}{m_p \beta} + v_g \Delta t + B_{2,x}, \quad \text{(Eq. 19)}$$

wherein $B_1(=B_1(N\Delta t))$ and $B_2(=B_2(N\Delta t))$ are random functions of time used to express Brownian motion of a particle, both of which follow Gaussian distribution and have a mean value of zero. The square mean value of $B_1$ and $B_2$ are expressed as follows:

$$<B_{1,x}^2> = \frac{kT}{m_p}(1 - e^{-2\beta\Delta t}) \quad \text{(Eq. 20)}$$

$$<B_{2,x}^2> = \frac{2kT}{m_p \beta^2}\left[\beta\Delta t - 2\left(\frac{1 - e^{-\beta\Delta t}}{1 + e^{-\beta\Delta t}}\right)\right], \quad \text{(Eq. 21)}$$

wherein k is Boltzmann constant, T is the temperature, $m_p$ is the mass of a particle, $\mu$ is the viscosity of $N_2$, $\beta$ is the friction constant $$\left(\beta = \frac{3\pi\mu d}{m_p C_c}\right),$$

and $\beta^{-1}$ represents $t_r$; N is the calculated step number, $C_c$ is the slip correction factor of a particle (Hinds W. C., Aerosol Technology, $2^{nd}$ Edition, Wiley-Interscience, 1998), and d is the diameter of a particle. To quantitatively describe the extent of diffusion, the diffusion force is also calculated by Eq. 22 (A. T. J. Kadaksham, P. Singh and N. Aubry, Electrophoresis 25, 3625, 2004; and Park H. et al., Journal of Aerosol Science, 32 (11); 1369-1388, November 2001).

$$F_{diff} = \left(\frac{6\pi\mu dkT}{C_c \Delta t}\right)^{0.5} \quad \text{(Eq. 22)}$$

Computational Simulation

In the model developed by the Applicants, the focus is on the incoming particle-substrate interaction and the resulted coverage selectivity of nanoparticles deposited on the patterned substrate. A sequential Brownian dynamic model is used because the particle-particle interaction is not taken into account, either in the gas phase or between an incoming particle and a deposited particle on the substrate surface. The simulated number concentration of particles in the control volume is at least $3*10^{13}$ cm$^{-3}$, which is much higher than that used in the experiment. Each trajectory is independent from the others in the following calculation.

Figure 11:
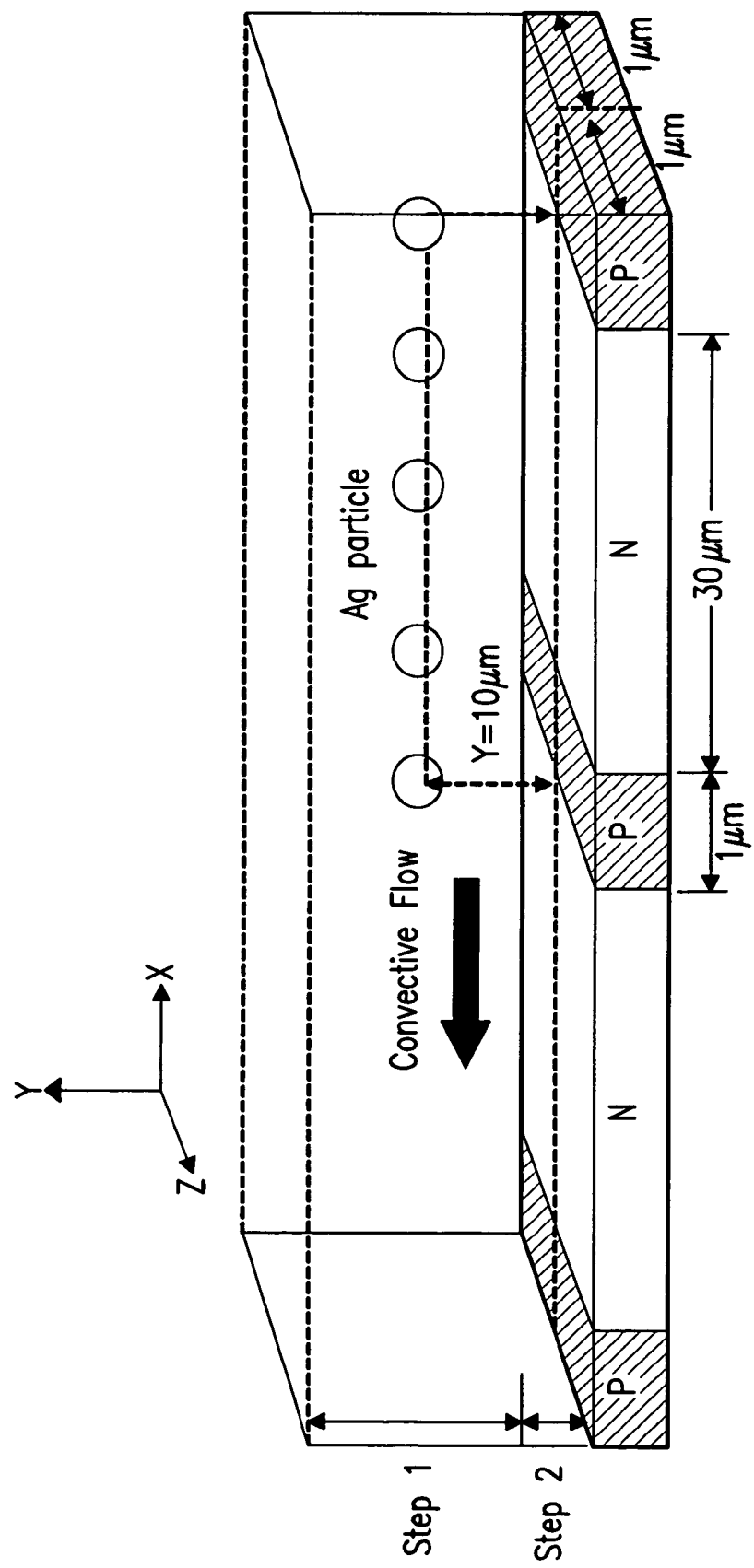
FIG. 11 shows a three-dimensional trajectory model, where six pairs of p-n junctions are located at the specific positions of a controlled volume.
Figure 12A:
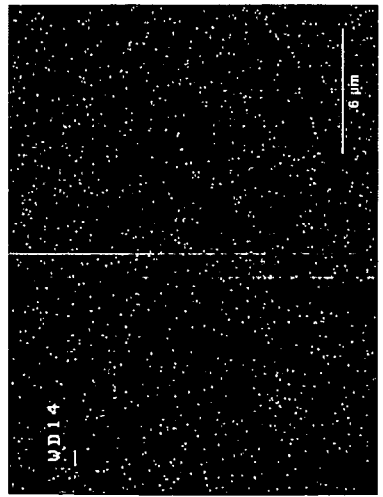
FIGS. 12A-12F; 13A-13F; 14A-14F show SEM images of the nanoparticle deposition patterns for particles with a size of 30 nm, 50 nm and 70 nm, respectively, at six different applied bias conditions, e.g., A: −0.1V; B: −0.3V; C: −0.5V; D: 0.6V; E: −0.7V; F: −0.9V.
Figure 12B:
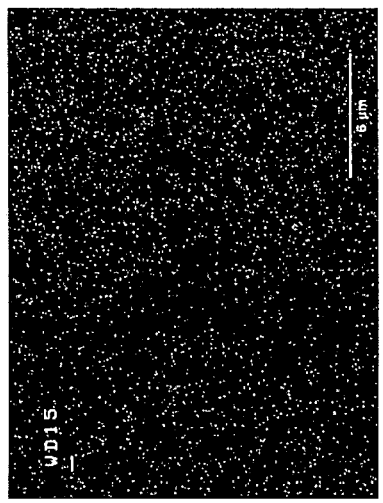
Figure 12C:
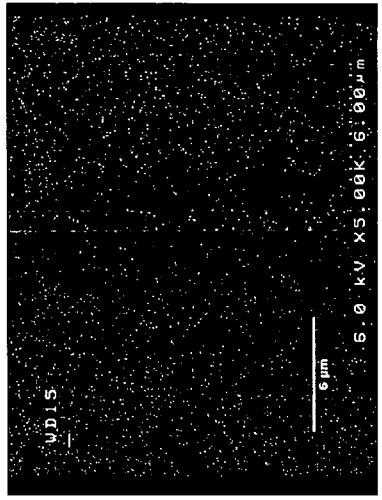
Figure 12D:
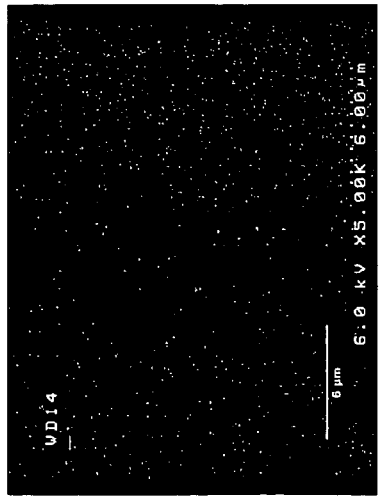
Figure 12E:
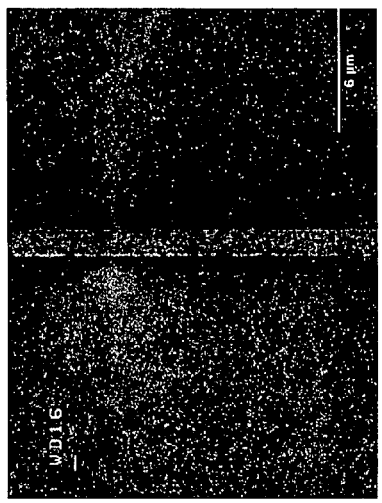
Figure 12F:
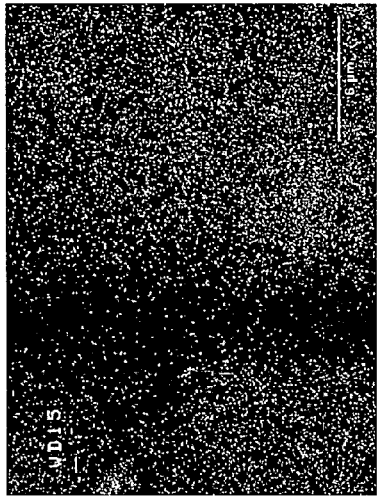
Figures 13A, 13B, 13C:
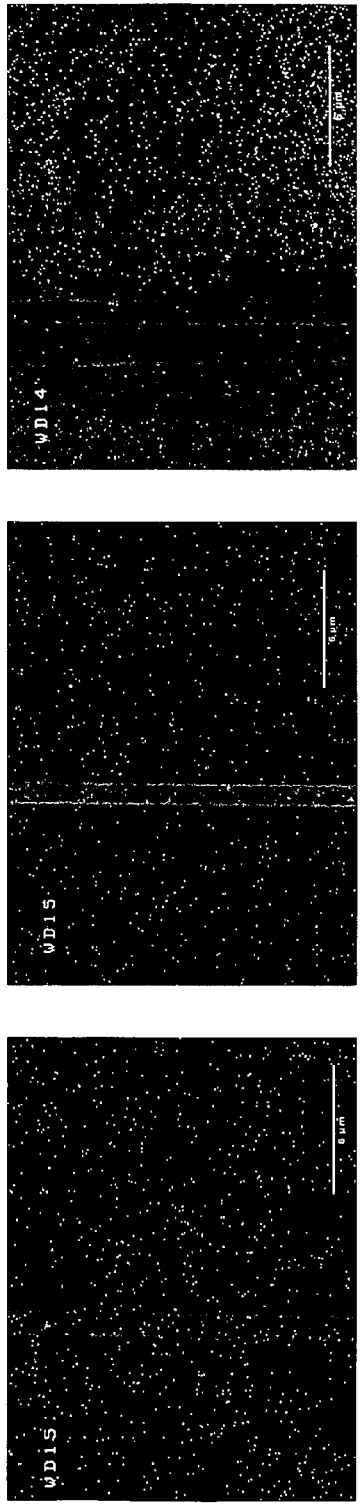
Figures 13D, 13E, 13F:
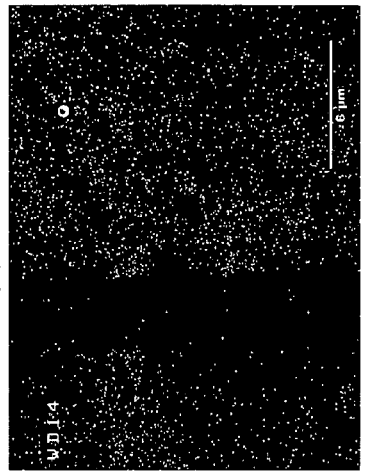

FIG. 11 is the schematic diagram of the 3-dimensional trajectory model in a control volume. In X coordinate, 6 pairs of p-n junctions are located on the substrate. In Z coordinate, 2 μm length is used by assuming that the electrostatic force weakly affects the incoming particle trajectory when r is larger than 1 μm. In Y coordinate, the surface of the substrate is defined as Y=0 and no upper boundary limit has been applied.

For the theoretical analysis, the effect of the particle size (d), electric field intensity ($E_s$), and the convective flow ($v_g$) on coverage selectivity are to be obtained. Three variables, d, $-V_{bias}$, and U, are applied in the following calculation and five different sized particles (d) are used, e.g., 1 nm, 30 nm, 50 nm, 70 nm and 100 nm. Applied reverse bias ($-V_{bias}$) range from 0 V to 1V, and U range from 0.2 m/s to 2 m/s.

Considering that Δt is used in the trajectory calculation, in Step 1 (Y>200 nm), it is determined that Δt is the time required for a particle to travel a certain distance, λ (65 nm). Assuming that the particles are fully-relaxed, based on the balance between the kinetic energy and the thermal energy, the required time for λ is different depending on the size of the particle. For a 30 nm particle, the required time for λ is ~400 ns. Consequently, in a 50 nm particle, the required time for λ is ~840 ns, and for a 70 nm particle, the required time for λ is ~1390 ns. These particles are respectively calculated by their diffusion velocity, $V_{diff}$. Δt=400 ns is chosen in the Step 1 when d is greater than 30 nm. For 1 nm, the required time for λ is ~2.5 ns, so Δt=3.1 ns is chosen. In Step 2 (0.5d<Y<200 nm), it is determined that Δt is the time required for a particle to travel a certain distance, $d_p$(~5 nm) calculated by their electrophoretic velocity, $V_e$. For a 30 nm sized particle, the required time for $d_p$ is ~10 ns assuming that $E_s$ is ~$10^6$ V/m. Δt=10 ns is chosen in Step 2 when d is greater than 30 nm. For 1 nm, the required time for $d_p$ is ~0.24 ns, so Δt=0.24 ns is chosen.

The initial position of particles is presented in FIG. 11. The starting height of the particle trajectory at Y=10 μm. In X-direction, particles are randomly distributed either in the first N-type or in the second P-type region (totally 31 um in length). The goal is to have a one-dimensional (in X-direction) comparison of the relative coverage on both P-type and N-type region. To reduce the complexity and calculation time, the forces in Z-direction including Brownian motion are not counted. Initially, the particles are located at $Z_0$=1 μm (in the middle of the Z-coordinate) so that $F_{tz}$=0. In the defined control volume, particles are convected by a gas flow from the right to the left, and the trajectory calculation of each particle is finished when it is out of the boundary or being deposited.

In order to have a more precise statistical result, a sufficient number of particle trajectories are required. In all, 2 to $12*10^4$ trajectories are applied to each calculation depending on the deposition efficiency. The final positions of the deposited particles are recorded as 1-D simulated deposition patterns after the whole trajectory calculation is completed. The coverage selectivity is also calculated by Eq. 8 from the 1-D simulated deposition patterns.

Comparison of Theory with Experimental Results (1) The Effect of the Electric Field FIGS. 12A-14F show SEM images of p-n junction patterned substrates following particle deposition for 3 different sized particles under various reverse bias voltages. In the experiments conducted, all Ag particles are negatively charged in the gas phase. Due to the electrostatic interaction, the Ag nanoparticles are expected to be deposited only on the N-type region and repelled from the P-type region under a strong electric field. Generally, for 3 different sized nanoparticles shown in FIGS. 12A-14F, a significant particle-free zone is observed along the P-type region when $(-V_{bias})$>0.7V. As the reverse bias voltage is decreased to 0.1V, Ag nanoparticles are homogeneously distributed into the N-type and P-type regions. The effect of the electric field had also been observed for Ni nanoparticles, presented herein in previous paragraphs. Using the image analysis, $C_N$ and $C_P$ are calculated and then Eq. 8 is used to calculate the experimental coverage selectivity. For 30 nm-sized particles, images with higher magnification are sometimes required in order to identify the coverage selectivity at low particle coverage.

Figure 15B:
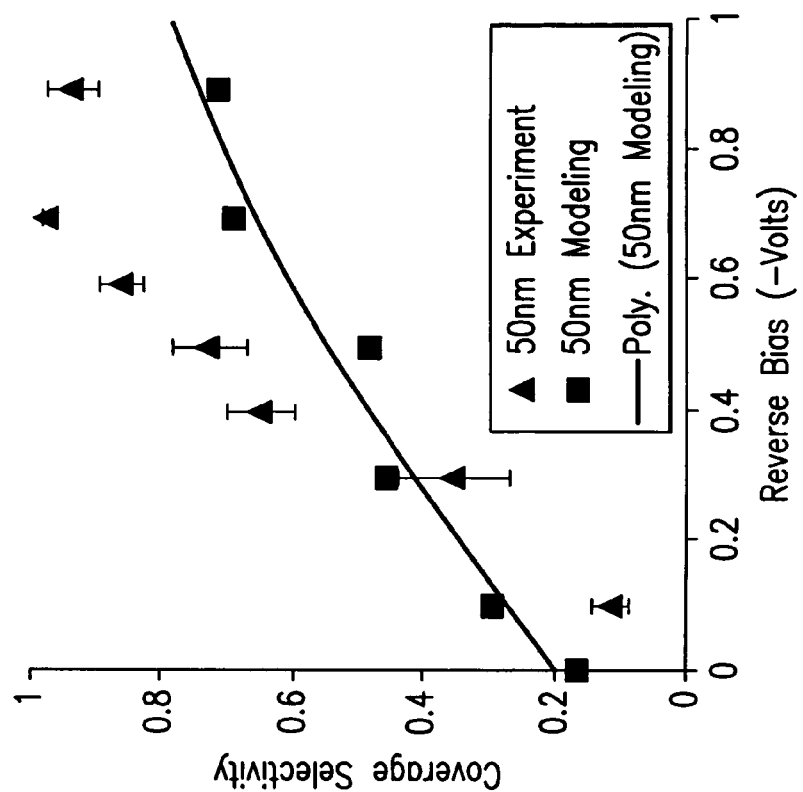
FIGS. 15A-15C are diagrams representing coverage selectivity vs. various reverse bias voltages for 30 nm sized particles (FIG. 15A), 50 nm sized particles (FIG. 15B), and 70 nm sized particles (FIG. 15C). Triangle points correspond to experimental data; square points correspond to modeling results; and solid lines correspond to fitting curve of the modeling results.
Figure 15A:
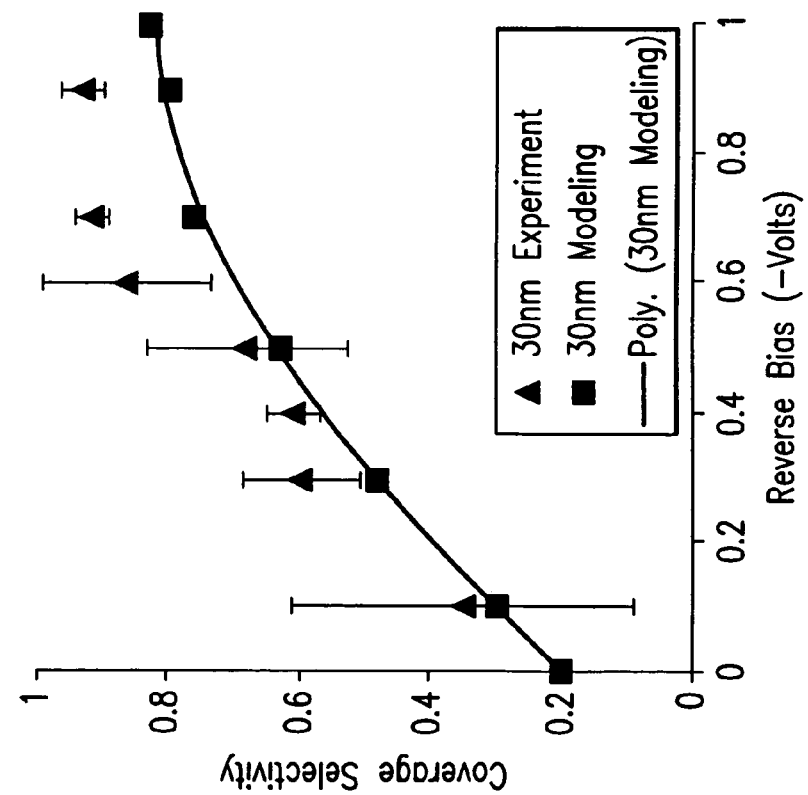
Figure 15C:
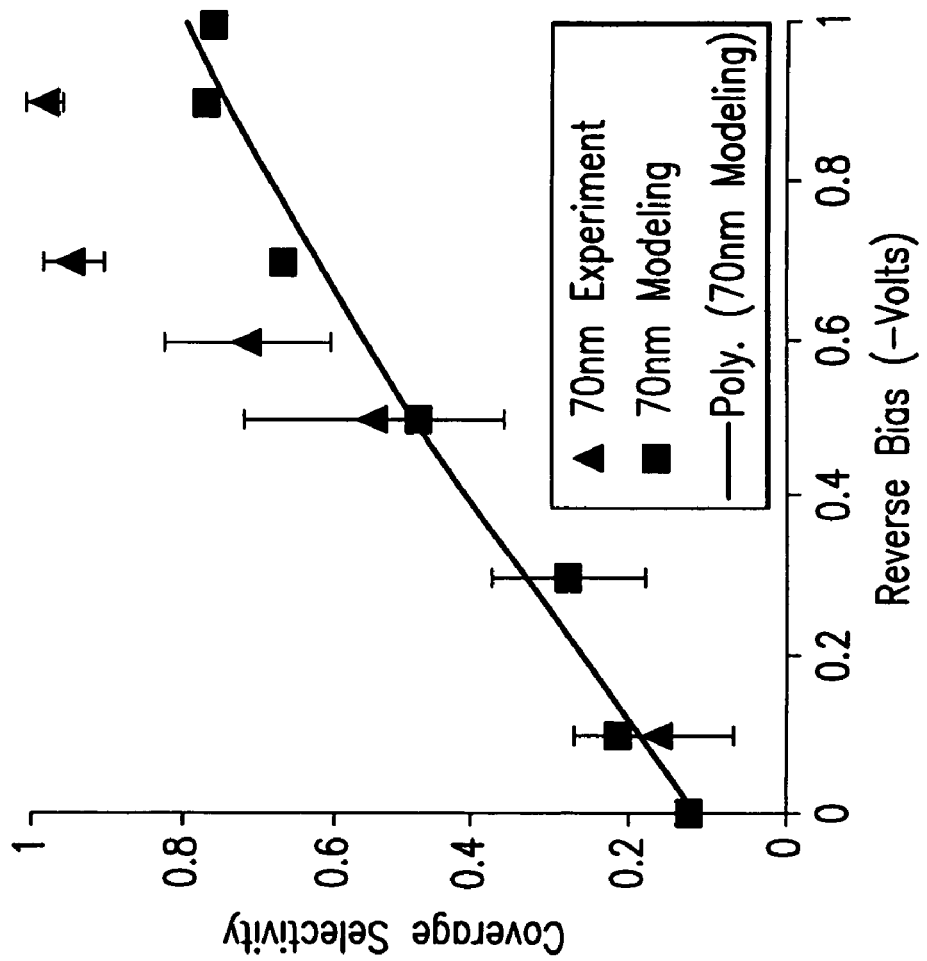

For the purpose of comparison, the simulation is performed by choosing similar parameters (reverse bias voltage, particle size, convective flow velocity, temperature and pressure) to the ones used in the experiments. In FIGS. 15A-15C, the coverage selectivity obtained from our modeling results is quantitatively compared with the calculated experimental coverage selectivity. It can be seen that the coverage selectivity increases both in theoretical calculation and the experimental results as the reverse bias is increased for all sized Ag particles. When $(-V_{bias})$>0.9V, a significant high coverage selectivity (~80%) is also achieved in the simulation. When $(-V_{bias})$<0.3V, low coverage selectivity is observed both in the simulation and the experiment.

This trend can be explained by understanding how forces act on the particles, especially the electrostatic force and diffusion force, presuming that the van der Waals force and image force have little effect in this system. For a specific sized particle, the electrostatic force is increased but the diffusion force is kept the same while increasing $(-V_{bias})$, as shown in Eqs. 11, 16, 17 and 22. For example, the diffusion force for 30 nm sized particle is kept at ~0.72 pN(Δt=$10^{-8}$ s) but the electrostatic force (assume L=300 nm and r=100 nm) is increased from ~0.4 pN to 1.5 pN as the reverse bias voltage is increased from 0.1V to be 0.9V. It is expected that it should have a minimum required electrostatic force driving Ag particles to overcome the combinational effect of all non-directional forces, such as image force, van der waals force and diffusion force. At $V_{bias}$=-0.9V, the electrostatic force was ~1.5 pN, which should have been strong enough, and the coverage selectivity could be increased when the reverse bias voltage is increased.

(2) The Effect of Particle Size

Figure 16:
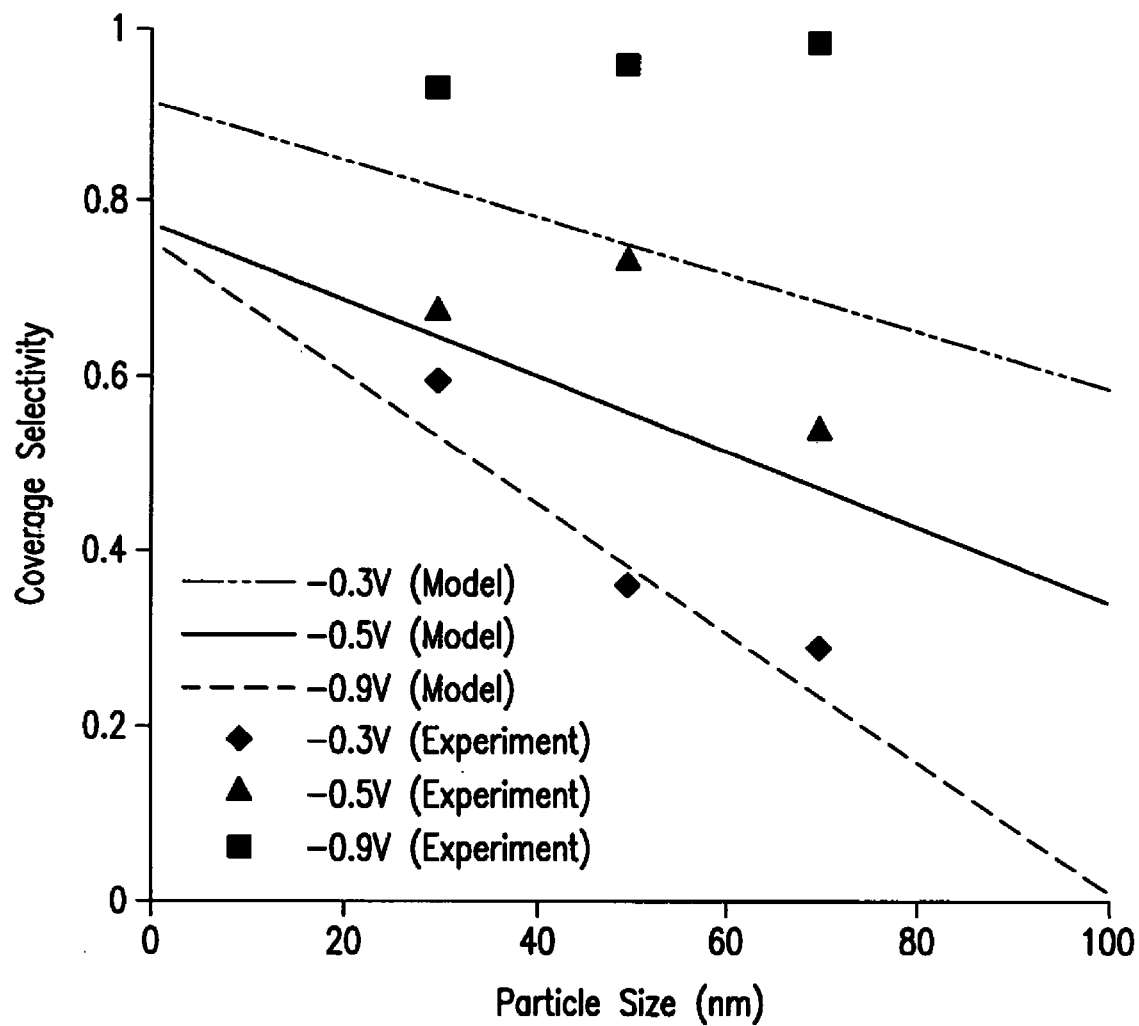
FIG. 16 is a diagram representing particle size vs. coverage selectivity under three different reverse bias voltages: −0.3V, −0.5V, and −0.9V. Modeling results are represented by the fitting lines.

FIG. 16 displays the relationship of particle size vs. coverage selectivity under various reverse bias conditions. To identify the effect of particle size, the slope [defined as Δ(-coverage selectivity)/Δd] can be observed of each line in FIG. 16. The sharper is the slope, the stronger is the effect of particle size. As the reverse bias voltage is decreased from 0.9V, 0.5V, to 0.3V, the effect of particle size increased. Smaller sized particles achieved higher coverage selectivity at lower reverse bias conditions.

This trend can also be interpreted by the aforementioned theory. This effect of particle size can be compared to Eqs. 11 and 22. In a uniform but insufficient electric field, for different sized particles, $F_e$ is the same but $F_{diff}$ changes. As the particle size is decreased, $F_{diff}$ decreased. Hence, coverage selectivity increased as d decreased. Based on this simulation and experiment, it is concluded that when the particle size ranges from 30 to 70 nm, a significant electrostatic force (~1.5 pN at $V_{bias}$=-0.9V) should be strong enough to steer the nanoparticles and overcome the random motion by diffusion force. Further analysis will be discussed in Section 4 (Non-Dimensional Analysis).

(3) The Effect of the Convective Flow

Figure 17A:
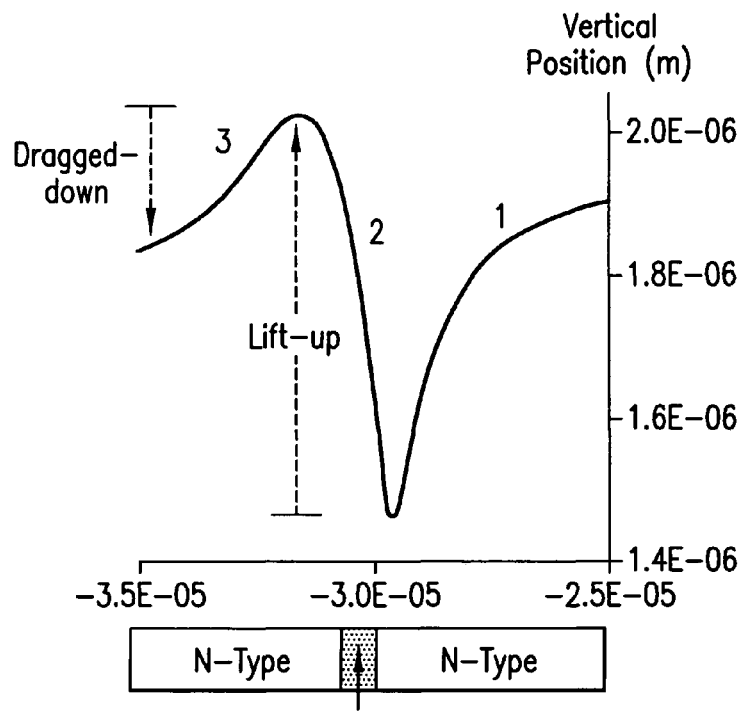
FIGS. 17A-17B are diagrams representing the analysis of a single particle trajectory without Brownian motion.
Figure 17B:
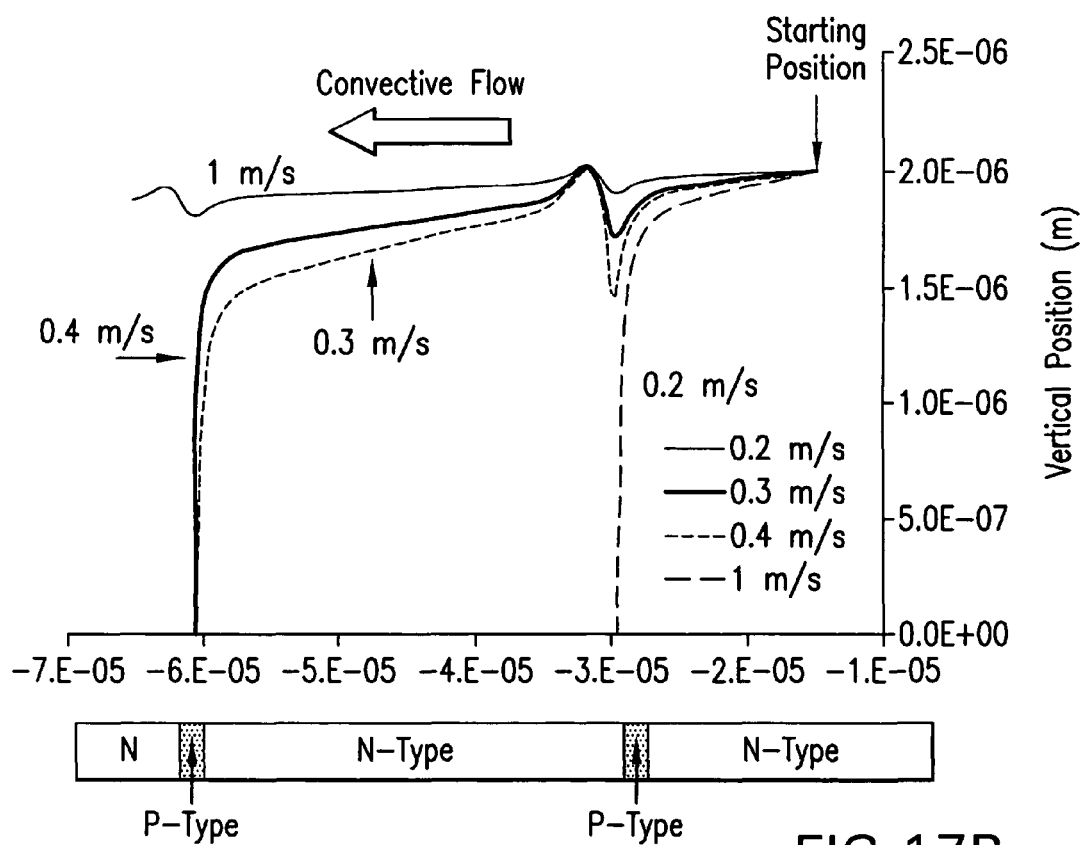

The asymmetry of the particle free zone observed in the experiments (FIGS. 12-14), as well as with the Ni nanparticle patterns (FIGS. 6A-6F; 7A-7F), results from the convective flow applied for carrying nanoparticles. As shown in FIG. 9, the gas flow close to the substrate essentially flows in parallel to the substrate surface. As shown in FIG. 17A, when a negatively-charged particle enters the P-type region which has a negative electric field, it is lifted up by the repulsive force from the P-type depletion zone and then convected out of that region. After leaving the P-type region, this particle is dragged down by the attractive force from the N-type depletion zone. The height of the lift-up and dragged-down process is determined by the flight time of a particle across the electrostatic-patterned regions (approximately 1 µm for both positive and negative charge regions). Under the same electric field, the average flight time of a particle is proportional to $U^{-1}$, which indicates that the lift-up and dragged-down distance will be increased if the convective flow velocity is decreased. From the analysis of a single particle trajectory regardless of Brownian motion shown in FIG. 17B, the lift-up and dragged-down distances were increased from ~0.1 µm to ~0.5 µm and ~0.05 µm to ~0.2 µm respectively when U was decreased from 1 m/s to 0.3 m/s. From this, it can be clearly seen that the lift-up height is at least twice as higher than the dragged-down distance. Because of the wider spacing of n-type region (30 µm), the repulsive force acting on a particle is stronger than the attractive force when a particle went across the p-n junction. The lift-up particle was convected out by the gas flow and would prefer to be deposited farther down stream and close to the charged N-type region.

Figure 18A:
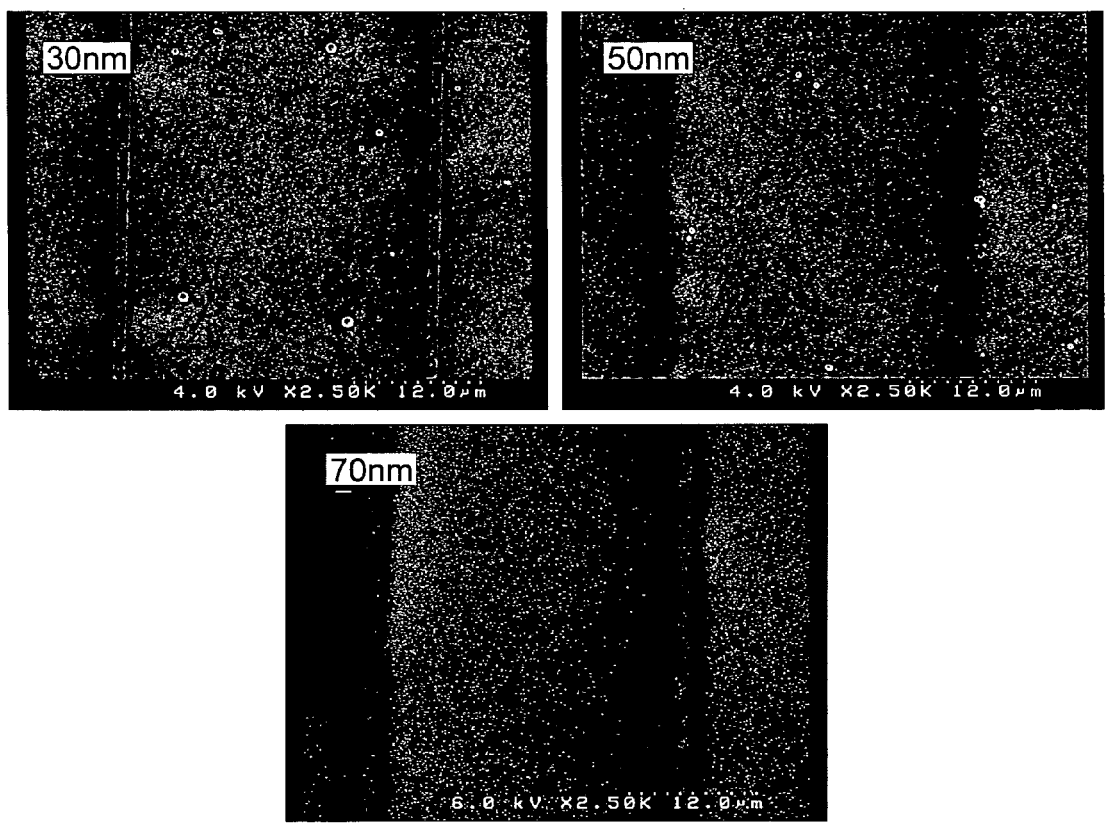
FIG. 18A shows SEM images of asymmetric nanoparticle patterns. Applied bias voltage is −0.9V for 30 nm, 50 nm, and 70 nm sized particles.
Figure 18B:
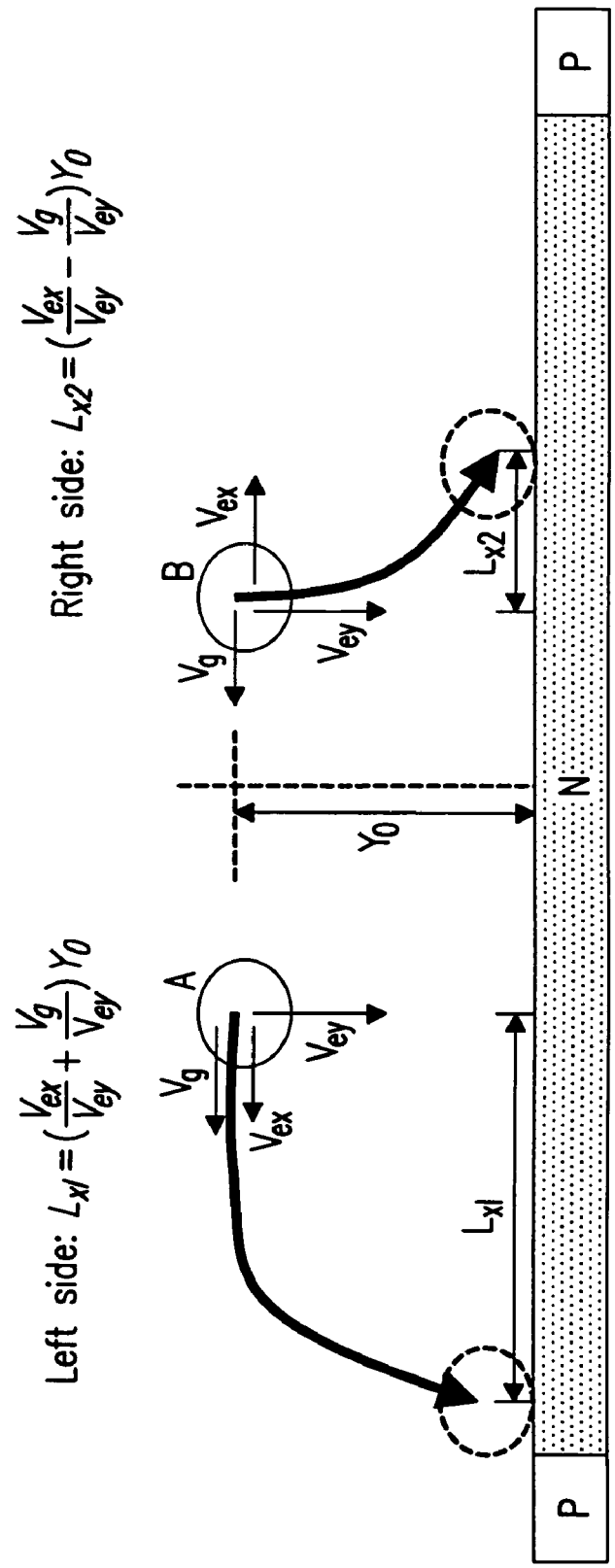
FIG. 18B shows formation of the asymmetry. $V_{ex}$ and $v_{ey}$ are the electrophorectic velocities in x and y direction, and $v_g$ is the convective flow velocity. Particle A was located on the left side and particle B was located on the right side of the middle line.

This asymmetry is also dependent on size of the nanoparticles. As shown in FIG. 18A, a stronger asymmetry can be seen on 70 nm sized particles than on 50 nm and 30 nm ones when a high reverse bias voltage, $V_{bias}$=−0.9V, is supplied. A proposed schematic diagram is described in FIG. 18B. If two particles, A and B, are initially placed on each side of the middle line where $F_{e,x}$=0, the particle A moves toward the left and the particle B might move toward the right or be convected to the left by $v_g$. $L_{x1}$ and $L_{x2}$ are the flight distances for particles A and B, respectively. The asymmetry would disappear when $L_{x1}$=$L_{x2}$. When the particle size is increased, $L_{x1}$ increases but $L_{x2}$ decreases. A clear asymmetry is expected to be seen for large sized particles.

Because of the y-directional electric field and x-directional convective flow, it is difficult to avoid the asymmetry in the present system. If x-directional convective flow did not exist in the system, this kind of asymmetry is expected to vanish. Based on this idea, if $v_g$ is perpendicular to the substrate (parallel to the vertical electric field) or is without $v_g$, this kind of asymmetry can be avoided.

Figure 19:
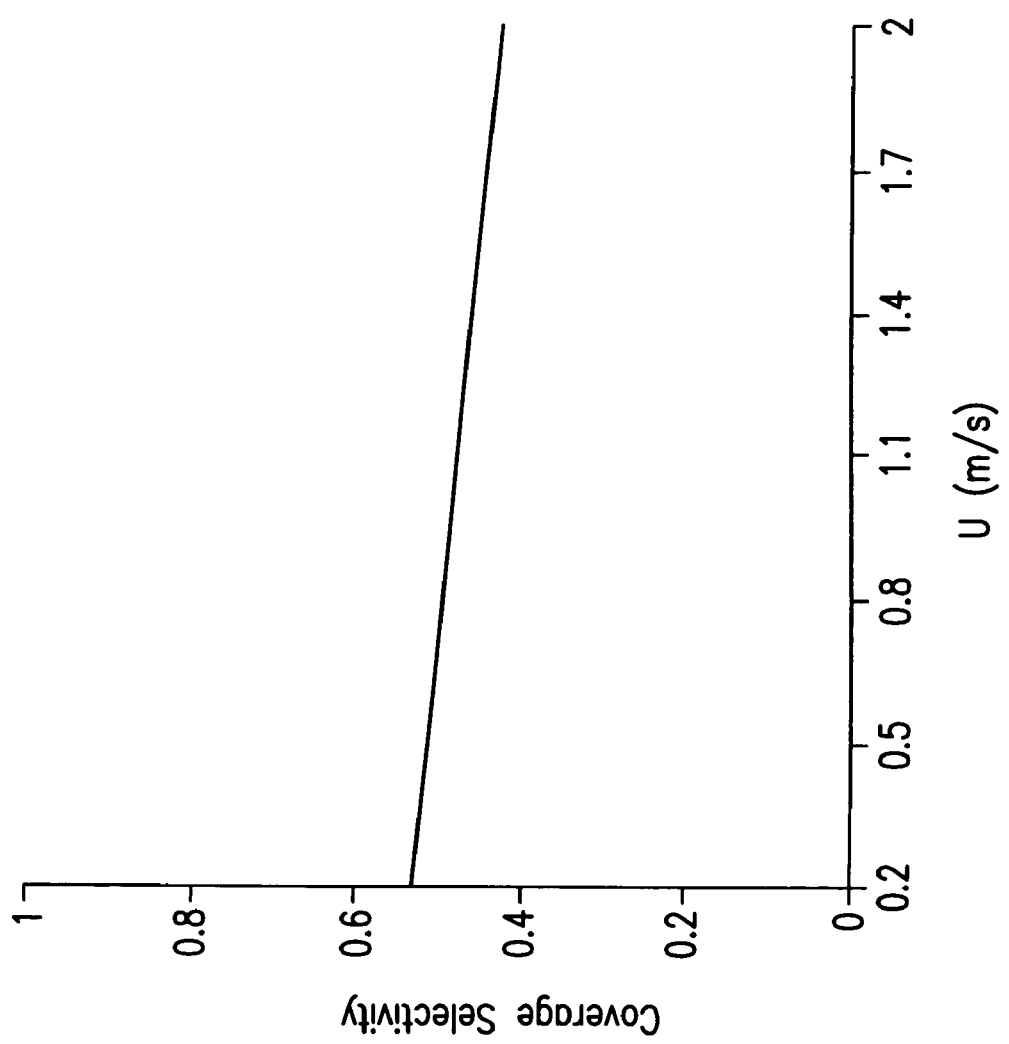
FIG. 19 is a diagram illustrating coverage selectivity vs. the convective flow velocity obtained by modeling. U is the free-stream velocity used in the calculation.

It is necessary to understand the effect of the convective flow affecting the coverage selectivity as well as this asymmetry. In the present model, nanoparticles are carried by a convective flow in a control volume parallel to the substrate surface having no preference for assisting particle deposition on either P-type or N-type region. Both $F_{diff}$ and $F_e$ are kept the same when $v_g$ is adjusted. From the modeling results shown in FIG. 19, a weak dependence of coverage selectivity is observed on $v_g$. Because of this weak dependence, the convective flow velocity as a variable is not included in the following non-dimensional analysis.

(4) Non-Dimensional Analysis

To study the effect of particle size, $F_e$, $F_D$, and $F_{diff}$ by the ratio of electrophoretic velocity, $v_e$ (a balance of the electrostatic force and the drag force) is compared to diffusion velocity, $v_{diff}$. For a generalized analysis, a non-dimensional parameter, ND, is developed which physically represents the extent of directional motion by the electrostatic force against non-directional Brownian $$ND = \frac{v_e}{v_{diff}} \quad \text{(Eq. 23)}$$

$$= \frac{F_e \times Z}{\sqrt{\frac{kT}{m_p}}}$$

$$= \frac{e}{3\sqrt{\left(\frac{6k\pi}{\rho}\right)}} \times \frac{nE_s d^{0.5}}{\mu\sqrt{T}} \times$$

$$\left(1 + \frac{\lambda}{d}\left[2.34 + 1.05\exp\left(-0.39\frac{d}{\lambda}\right)\right]\right),$$

wherein $$Z = \frac{C_c}{3\pi\mu d}$$

is the mobility of a particle, λ is the gas mean free path (Hinds, W. C., Aerosol Technology, $2^{nd}$ Edition, Wiley-Interscience, 1998), and $v_e$, and $V_{diff}$ are the electrophoretic and diffusion velocity of a particle.

Figure 20B:
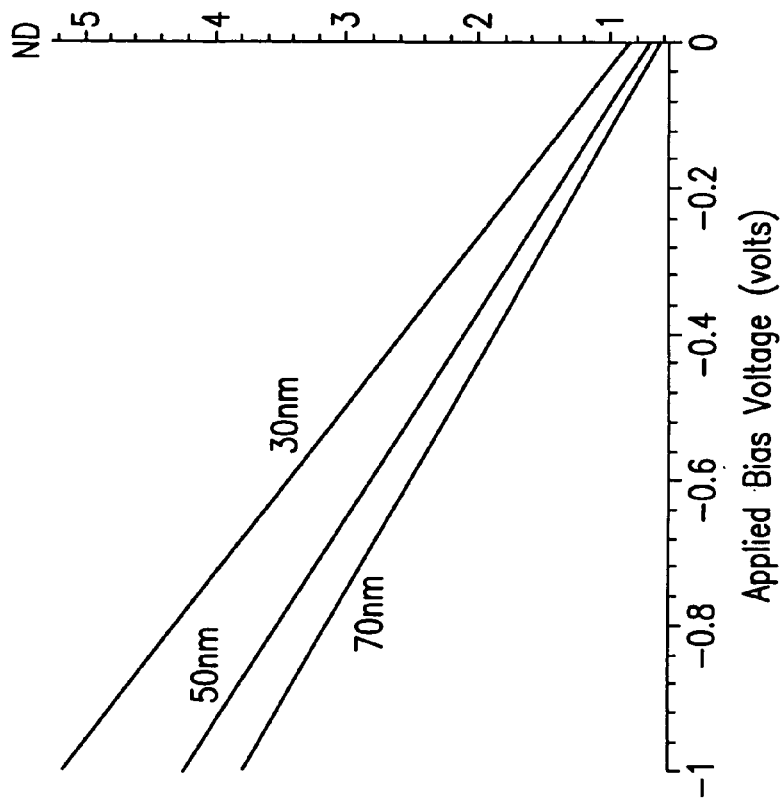
FIGS. 20A-20C are diagrams representing ND vs. particle size at three different reverse bias conditions; ND vs. applied reverse bias voltage for three different sized particles; and coverage selectivity vs. ND, respectively, for non-dimensional analysis.
Figure 20A:
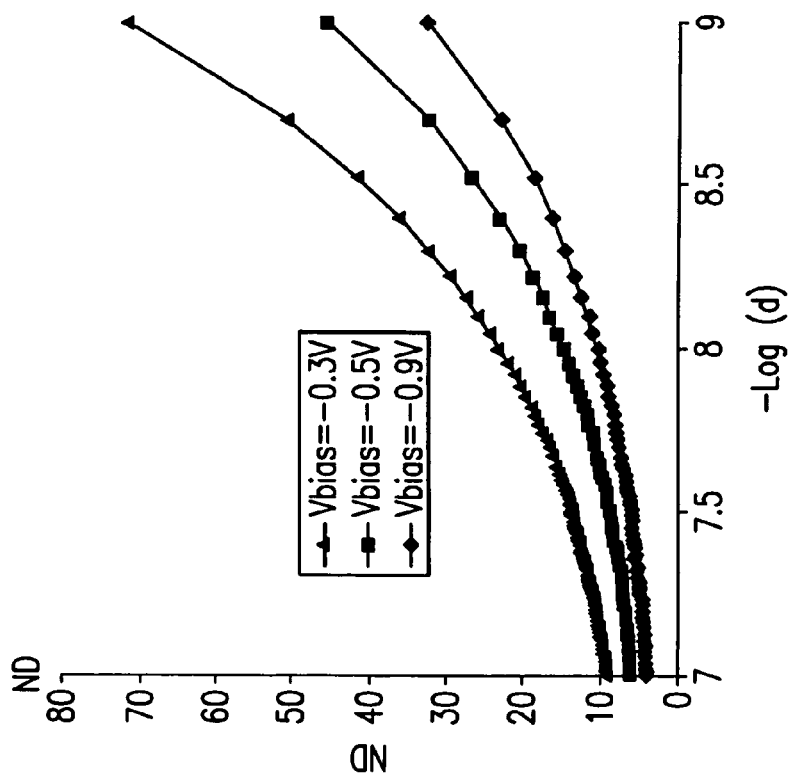

From Eq. 23, it is observed that ND∝$d^{-0.5}$ while d<<λ and ND∝$d^{0.5}$ while d>>λ. As shown in FIG. 20A, when d<100 nm and under the same reverse bias voltage, ND is increased as d is decreased. It indicated the electrostatic-directed process is more effective for a smaller sized particle when d<100 nm. ND is independent of d when d ~200-300 nm and proportional to $d^{0.5}$ when d>400 nm. The non-dimensional parameter ND was calculated for 30 nm, 50 nm, and 70 nm sized particles as shown in FIG. 20B. ND is also increased when the reverse bias voltage is increased. For 30-70 nm sized particles, ND can be simplified as ND=$K_{an}V_s d^{-0.38}$. Assuming P=1 atm, T=298 K, r=100 nm, and L=100 nm, then $K_{an}$ is ~0.0059.

If positively-charge particles are to deposited onto the N-type region (FIGS. 7A-7E), the Eq. 23 is also applicable but in this case, $K_{ap}$($K_{ap}$=$K_{an}$×f) must be used instead of $K_{an}$.

For the current design of the patterned substrate, f should be less than 1 because a wider spacing in positive charge region (30 µm) reduces the repulsive electrostatic force. As was previously observed, f should be ~0.4 for the current p-n substrate. In other words, either the d is to be decreased, or the reverse bias voltage is to be increased in order to obtain the same ND.

Figure 20C:
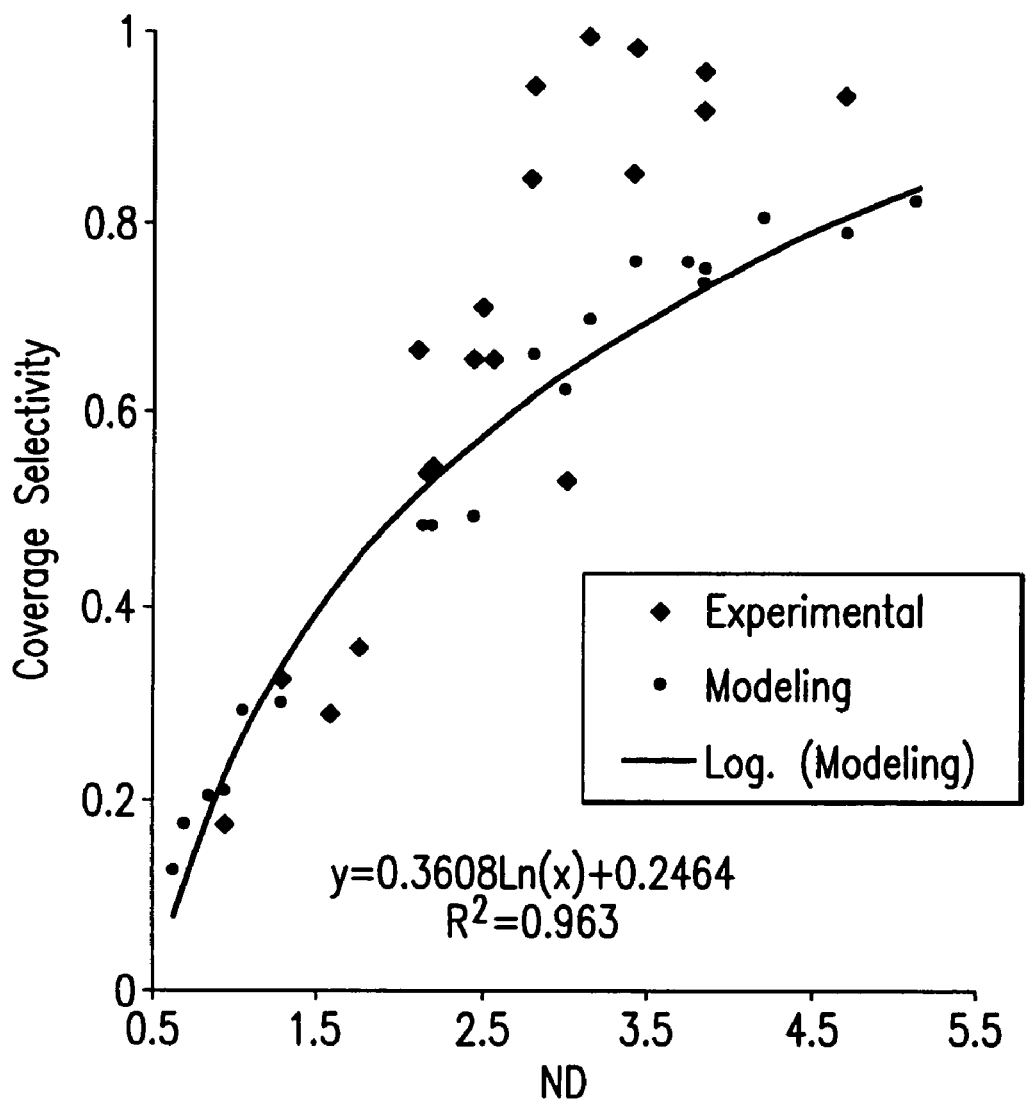

The ND parameter is applied into both the experimental and the modeling results to see the trend of coverage selectivity v.s ND (FIG. 20C). Mostly the experimental data points are located close to the modeling fitting curve. It is generally concluded that the most important factor in this system is the electrostatic force and diffusion force, mostly affected by the applied reverse bias voltage and particle size respectively in the current analysis. The ND parameter can be applied for estimating the process performance. For example, at ND=4.5, at least 80% of coverage selectivity can be achieved. If it is needed to have 80% coverage selectivity, the ND has to be set to be 4.5 by either reducing d or by increasing $(-V_{bias})$.

A deviation of 50 nm and 70 nm sized particles is observed at higher reverse bias voltages in the experiment, as shown in FIG. 20C. It might result from the particle-particle interaction, the formation of multiply charged particles, or both. Particle-Particle interaction is important when deposited nanoparticles highly cover the surface of a substrate. The deposited particles become attractive sites for incoming particles due to the image force and van der Waals force between particles, especially van der Waals force, $F_{vdw\_p\_p}$ in the system. $F_{vdw\_p\_p}$ is proportional to d when particle-particle distance, S, is short, so that larger sized particles have stronger attractive force to induce another incoming particle to be deposited. For example, when S is 30 nm, $F_{vdw\_p\_p}$ is 0.03, 0.13, and 0.30 pN for 30 nm, 50 nm and 70 nm sized particles, respectively. For 50 nm and 70 nm sized particles, after unipolar charging, multiply-charged particles (n>1) might be generated and this process enhances electrostatic-directed deposition (Eq. 11).

(5) The Effect of System Pressure and Temperature

Figure 21:
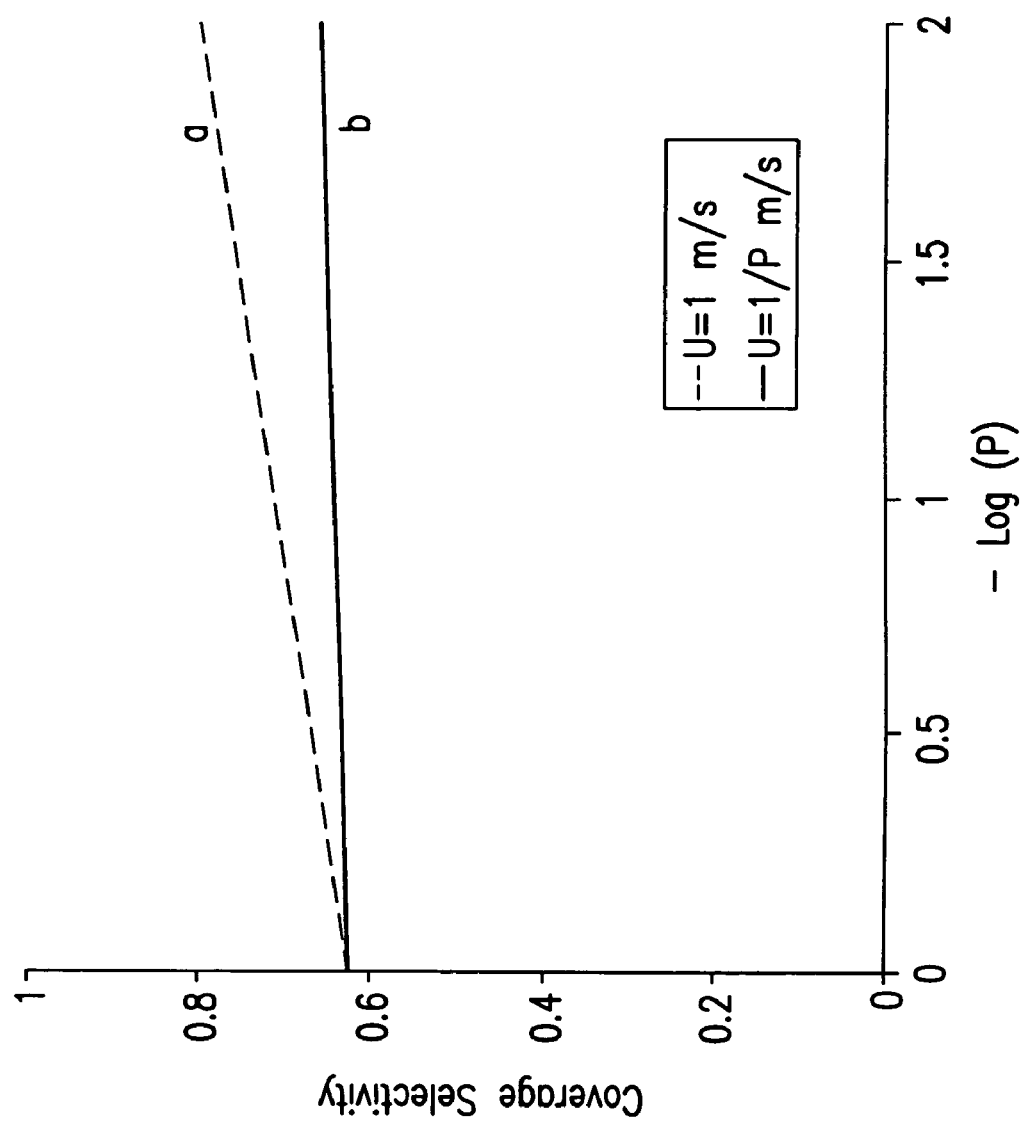
FIG. 21 is a diagram representing coverage selectivity vs. pressure (the unit of P is atm). Curve "a" corresponds to a constant U (1 m/s) at different pressure; curve "b" corresponds to U which was changed when the pressure was changed (U=1/P).

Based on ND analysis, the effect of the pressure and temperature in the system can be generated. When P is decreased, $\lambda$ increases and then $C_c$ also increases. From Eq. 23 it can be seen that ND is increased when P is reduced. For example, when the pressure is reduced from 1 atm to be 0.1 atm, approximately, $v_e$ increases 10-times without any change on $v_{diff}$. Because of the increase of ND, it is possible to have higher coverage selectivity when P is reduced. However, as is observed in FIG. 21 (curve "a"), assuming that the convective velocity is kept the same, the coverage selectivity is only increased 9% when the pressure is reduced from 1 atm to 0.1 atm. When P is decreased, because of the mass balance of the gas flow applied, the convective flow velocity should increase and it should be proportional to $P^{-1}$. Considering the change of convective flow velocity, as shown in FIG. 21 (curve "b"), no significant change of coverage selectivity is observed when P is changed.

In the ND analysis, the effect of inertial movement of a particle is not taken into account, but only its terminal velocity. When the pressure is reduced, the effect of inertial movement of a particle also increases due to the increase of particle relaxation time, $t_r$, which is proportional to $P^{-1}$. To successfully steer particles by the electrostatic force, the trajectories of particles should follow the sign of the applied electric field when particles move across the p-n junction. If particles are not fully-relaxed, they might be able to deposit on the region having positive electrostatic force by their strong inertial movement. In the simulation, the relaxation time has been taken into account but ND analysis are not. This would be the reason that no significant enhancement is observed when the pressure is reduced in the modeling calculation.

Because µ is proportional to $T^{0.5}$ (from Eq. 23), ND is weakly dependent on T. However, when the increase of particle relaxation time is taken into account, it can be expected that coverage selectivity should decrease when the temperature T is increased. Besides, from the force analysis, if the temperature is increased, the diffusion force should increase but the electrostatic force should be the same. To reduce Brownian motion and the inertial movement of nanoparticles, it would be better to operate this process at lower temperature.

The electrostatic-directed assembly approach is demonstrated as an effective method for positioning metal nanoparticles. Brownian dynamic simulation provides a better understanding about the mechanism to position nanoparticles on the patterned substrate. This is the first model to predict the performance of selectively electrostatic-directed depositing nanoparticles from the gas phase to a p-n junction-patterned substrate. The major factor to achieved high coverage selectivity is the intensity of electric field, which is controlled by the applied reverse bias voltage across the p-n junction. The size of particles is to be controlled, as the smaller sized particles are easier to be steered by this electrostatic-directed method when the supplied electric field is at a moderate level. The temperature and/or the pressure in the deposition chamber can also be controlled to attain an enhanced deposition quality. The principles of the present invention can be extensively applied to other p-n junction patterned substrate with different design, and more precisely to direct the nanoparticles to the designed position and to form a stable nanoparticle pattern on a substrate. The use of multi-charged (n>1) nanoparticles for deposition may also contribute to the quality of the deposited patterns.

Although this invention has been described in connection with specific forms and embodiments thereof, it will be appreciated that various modifications other than those discussed above may be resorted to without departing from the spirit or scope of the invention as defined in the appended Claims. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A method for controllable deposition of nanoparticles on a substrate, comprising the steps of:
   patterning said substrate to create at least one p-doped and at least one n-doped regions thereon, at least one pn junction being established therebetween;
   generating a vapor containing a plurality of nanoparticles;
   charging said nanoparticles for imposing a predetermined polarity on said plurality of nanoparticles;
   projecting said vapor toward said substrate for depositing said charged nanoparticles thereon; and
   applying an electric field to said at least one pn junction during said deposition of nanoparticles for selectively controlling said plurality of nanoparticles in depositing position on respective ones of said p-doped and n-doped regions, depending on the predetermined polarity of said plurality of nanoparticles.

2. The method of claim 1, wherein said plurality of nanoparticles are charged with a negative polarity, and are deposited on said at least one n-doped region.

3. The method of claim 1, wherein said plurality of nanoparticles are charged with a positive polarity, and are deposited on said at least one p-doped region.

4. The method of claim 1, wherein said electric field is a bias electrical field reversely applied to said at least one pn junction.

5. The method of claim 1, wherein the deposition of said plurality of nanoparticles occur after said electrical field reaches a predetermined level, the method further comprising the step of varying said electric field to reach said level thereof.

6. The method of claim 1, wherein said plurality of nanoparticles includes metal nanoparticles.

7. The method of claim 1, further comprising the steps of: forming on said substrate an array of said p-doped and n-doped regions.

8. The method of claim 7, further comprising the steps of: forming on said substrate a plurality of said p-doped and n-doped regions sized and positioned on said substrate in correspondence with an architecture of a nanoparticle based device to be fabricated.

9. The method of claim 1, further comprising the step of: positioning said plurality of nanoparticles a predetermined distance from said substrate, wherein said electric field directs said plurality of nanoparticles towards said substrate.

10. The method of claim 1, further comprising the step of: changing said predetermined polarity of said plurality of nanoparticles to the polarity opposite to said predetermined polarity, thereby depositing said plurality of nanoparticles on a region opposite to said respective one of said at least one p-doped and n-doped regions.

11. The method of claim 1, further comprising the step of selecting nanoparticles sized in a predetermined size range from said plurality of nanoparticles.

12. The method of claim 1, further comprising the step of controlling a process parameter, selected from a group consisting of process temperature and process pressure.

13. The method of claim 1, wherein said charged nanoparticles in said vapor are steered responsive to said electric field toward one said region of said substrate doped with like polarity.

14. The method of claim 1, wherein said plurality of nanoparticles are charged to form a plurality of multi-charged nanoparticles, wherein a number "n" of unit charges on each said nanoparticle is greater than 1.

* * * * *